United States Patent
Iwamoto

(10) Patent No.: US 9,246,462 B2
(45) Date of Patent: Jan. 26, 2016

(54) METHOD FOR MANUFACTURING PIEZOELECTRIC DEVICE

(71) Applicant: Murata Manufacturing Co., Ltd., Nagaokakyo-shi, Kyoto-fu (JP)

(72) Inventor: Takashi Iwamoto, Nagaokakyo (JP)

(73) Assignee: Murata Manufacturing Co., Ltd., Kyoto (JP)

(*) Notice: Subject to any disclaimer, the term of this patent is extended or adjusted under 35 U.S.C. 154(b) by 305 days.

(21) Appl. No.: 13/850,513

(22) Filed: Mar. 26, 2013

(65) Prior Publication Data

US 2014/0130319 A1    May 15, 2014

Related U.S. Application Data

(63) Continuation of application No. PCT/JP2011/072160, filed on Sep. 28, 2011.

(30) Foreign Application Priority Data

Sep. 28, 2010  (JP) .................................. 2010-216935

(51) Int. Cl.
*H03H 3/02* (2006.01)
*H01L 41/312* (2013.01)
(Continued)

(52) U.S. Cl.
CPC .............. *H03H 3/02* (2013.01); *H01L 41/312* (2013.01); *H01L 41/37* (2013.01); *H03H 3/08* (2013.01);
(Continued)

(58) Field of Classification Search
CPC .............. H03H 3/02; H03H 2003/023; H03H 2003/025; H03H 3/08; H03H 9/02543; H03H 9/02574; H03H 9/059; H03H 9/173; H03H 9/174; H01L 41/312; H01L 41/37; H01L 21/02697; Y10T 29/42; Y10T 29/49005; Y10T 29/49124
See application file for complete search history.

(56) References Cited

U.S. PATENT DOCUMENTS 6,445,265 B1    9/2002 Wright
6,767,749 B2 *  7/2004 Kub et al. ............. H01L 41/312
(Continued)

FOREIGN PATENT DOCUMENTS

JP    2002-534886 A    10/2002
JP    2003-17967 A     1/2003
(Continued)

OTHER PUBLICATIONS

Official Communication issued in International Patent Application No. PCT/JP2011/072160, mailed on Nov. 8, 2011.

*Primary Examiner* — A. Dexter Tugbang
(74) *Attorney, Agent, or Firm* — Keating & Bennett, LLP

(57) ABSTRACT

In a method of manufacturing a piezoelectric device, a compressive stress film is formed on a back surface of a piezoelectric single crystal substrate opposite to a surface on an ion-implanted side. The compressive stress film compresses the surface on the ion-implanted side of the piezoelectric single crystal substrate. The compressive stress produced by the compressive stress film is applied to half of the piezoelectric single crystal substrate on the ion-implanted side with respect to the center line of the thickness of the piezoelectric single crystal substrate to prevent the piezoelectric single crystal substrate from warping. A supporting substrate is then bonded to the surface of a bonding film on the flat piezoelectric single crystal substrate. The joined body of the piezoelectric single crystal substrate and the supporting substrate is then heated to initiate isolation at the ion-implanted portion as the isolation plane.

20 Claims, 22 Drawing Sheets

(51) Int. Cl.
  *H03H 9/17* (2006.01)
  *H01L 41/37* (2013.01)
  *H03H 3/08* (2006.01)
  *H03H 9/05* (2006.01)
  *H03H 9/02* (2006.01)
  *H01L 21/02* (2006.01)

(52) U.S. Cl.
  CPC ........... *H03H 9/02574* (2013.01); *H03H 9/059* (2013.01); *H03H 9/173* (2013.01); *H03H 9/174* (2013.01); *H01L 21/02697* (2013.01); *H03H 9/02543* (2013.01); *H03H 2003/023* (2013.01); *H03H 2003/025* (2013.01); *Y10T 29/42* (2015.01); *Y10T 29/49005* (2015.01); *Y10T 29/49124* (2015.01)

(56) References Cited

U.S. PATENT DOCUMENTS

2010/0107388 A1\* 5/2010 Iwamoto .................. H03H 3/02
2010/0293770 A1  11/2010 Fuyutsume et al.
2011/0266918 A1  11/2011 Iwamoto et al.

FOREIGN PATENT DOCUMENTS

| JP | 2010109909 A | * | 5/2010 |
| WO | 2009/093376 A1 | | 7/2009 |
| WO | 2010/082571 A1 | | 7/2010 |

\* cited by examiner

METHOD FOR MANUFACTURING PIEZOELECTRIC DEVICE

BACKGROUND OF THE INVENTION

1. Field of the Invention

The present invention relates to a method for manufacturing a piezoelectric device that uses a thin film made of a piezoelectric single crystal material.

2. Description of the Related Art

Many kinds of piezoelectric devices that utilize a piezoelectric thin film, i.e., thin-film piezoelectric devices, are now under development. There are many ways to produce a piezoelectric thin film for the fabrication of thin-film piezoelectric devices. For example, Japanese Unexamined Patent Application Publication No. 2002-534886 proposes a method for manufacturing a piezoelectric device in which a piezoelectric thin film is formed by isolation from a piezoelectric substrate at an ion-implanted layer as the isolation plane.

The following describes this manufacturing method of a piezoelectric device, which includes forming a piezoelectric thin film by isolation from a piezoelectric substrate at an ion-implanted layer as the isolation plane, with reference to FIGS. 1A-1D.

FIGS. 1A-1D are schematic cross-sectional diagrams illustrating the manufacturing steps of a piezoelectric device according to Japanese Unexamined Patent Application Publication No. 2002-534886. The first step is to implant hydrogen ions into a piezoelectric substrate 5 from the front 7 side in a way that an ion-implanted layer 6 is formed at a predetermined depth d in the piezoelectric substrate 5 as illustrated in FIG. 1A. A coupling material 8 is then deposited on the front 7 of the piezoelectric substrate 5 by sputtering as illustrated in FIG. 1B. The next step is to join the piezoelectric substrate 5 and a supporting substrate 9 as illustrated in FIG. 1C. Finally, the joined body of the piezoelectric substrate 5 and the supporting substrate 9 is heated to initiate isolation at the ion-implanted layer 6 as the isolation plane. As a result, a piezoelectric thin film 5' is formed on the supporting substrate 9 as illustrated in FIG. 1D.

In the manufacturing method according to Japanese Unexamined Patent Application Publication No. 2002-534886, however, ion implantation (see FIG. 1A) causes the piezoelectric substrate 5 to be warped with the ion-implanted layer 6 side of the piezoelectric substrate 5 curved outwards as illustrated in FIG. 2. This type of warpage occurs because the implanted ionized element causes the crystal lattice spacing of the piezoelectric material to extend in the ion-implanted portion of the piezoelectric substrate 5.

When the piezoelectric substrate 5 is in such a warped shape, bonding it to a supporting substrate 9 (see FIG. 1C) results in the piezoelectric substrate 5 adhering to the supporting substrate 9 with the crystal lattice spacing longer than that before ion implantation. The crystal lattice spacing in the piezoelectric thin film 5', which is left after bonding to the supporting substrate 9 and isolation at the ion-implanted layer, is therefore longer than that before ion implantation. It is, however, generally known that a piezoelectric thin film 5' having an extended crystal lattice spacing as above has lower piezoelectricity than one with no expansion of the crystal lattice spacing.

This means that piezoelectric thin film devices produced by the manufacturing method according to Japanese Unexamined Patent Application Publication No. 2002-534886 are disadvantageous because of degraded piezoelectricity. This is a fatal problem for the device characteristics of high-frequency filters in particular because in devices of this type, an extended crystal lattice spacing is a big factor for the degradation of piezoelectricity.

Heat treatment for the recovery of piezoelectricity expels the ions of the implanted element existing between the crystals from the piezoelectric thin film 5' by degasification and is expected to make the crystal lattice spacing of the piezoelectric thin film 5' return to that before ion implantation. However, the piezoelectric thin film 5' is bonded to the supporting substrate 9; it is confined by the supporting substrate 9 and unable to regain its crystal lattice spacing before ion implantation. In other words, the piezoelectric thin film 5' formed on the supporting substrate 9 is under shear stress. Piezoelectric thin film devices produced by the manufacturing method according to Japanese Unexamined Patent Application Publication No. 2002-534886 therefore has another disadvantage in that the piezoelectric thin film 5' is likely to be damaged.

SUMMARY OF THE INVENTION

Preferred embodiments of the present invention provide a method for manufacturing a piezoelectric device free of the problems associated with ion implantation, i.e., degradation of the piezoelectricity of the piezoelectric thin film and damage to the piezoelectric thin film.

According to a preferred embodiment of the present invention, a manufacturing method of a piezoelectric device preferably includes at least an ion implantation step, a stress layer formation step that can be a compressive stress film formation step or a tensile stress film formation step, a support formation step, and an isolation step.

The ion implantation step is a step of implanting an ionized element into a piezoelectric substrate such that a concentration peak of the element implanted into the piezoelectric substrate is formed in the piezoelectric substrate. The compressive stress film formation step is a step in which a compressive stress film that compresses the surface on the ion-implanted side of the piezoelectric substrate is formed as the stress layer on the back side, which is opposite to the surface on the ion-implanted side. When no provisional support is formed, the support formation step is a step of forming a support on the ion implantation plane side of the piezoelectric substrate. The isolation step is a step of heating the piezoelectric substrate to initiate isolation at the concentration peak of the element implanted into the piezoelectric substrate as the isolation plane to form the piezoelectric thin film on the front of the support.

The compressive stress film formed on the back side during the compressive stress film formation step in this manufacturing method applies compressive stress to the half of the piezoelectric substrate located on the ion-implanted side with respect to the center line of the thickness of the piezoelectric substrate. The applied compressive stress compresses the half of the piezoelectric substrate on the ion-implanted side with respect to the center line and causes this portion to contract. As a result, the piezoelectric substrate is relieved from its warped state and becomes substantially flat.

This ensures that the piezoelectric substrate has a substantially flat shape with reduced warpage while it is formed on a supporting substrate during the support formation step. Furthermore, the heat treatment in the isolation step expels the implanted ionized element existing in the piezoelectric thin film from the piezoelectric thin film by degasification and corrects the crystallographic strain in the piezoelectric thin film caused by the ion implantation step. These actions make the extended crystal lattice spacing in the piezoelectric thin film after ion implantation return to the length in the stable state before ion implantation. The piezoelectric thin film produced in this manufacturing method therefore has stable and satisfactory piezoelectricity.

Additionally, there is no shear stress exerted on the piezoelectric thin film in this manufacturing method because the piezoelectric thin film formed on the support still maintains the crystal lattice spacing before ion implantation.

This manufacturing method of a piezoelectric device is therefore free of the degradation of the piezoelectricity of the piezoelectric thin film and damage to the piezoelectric thin film.

A method for manufacturing a piezoelectric device according to a preferred embodiment of the present invention preferably includes at least a provisional support formation step. The provisional support formation step is a step of forming a provisional support on the ion implantation plane side of the piezoelectric substrate. When a provisional support is formed, the support formation step is a step of forming a support on the piezoelectric thin film isolated from the piezoelectric substrate in the isolation step.

In this manufacturing method of a piezoelectric device according to a preferred embodiment of the present invention, the piezoelectric substrate has a substantially flat shape with reduced warpage while a provisional support is formed on it during the provisional support formation step. This manufacturing method of a piezoelectric device according to a preferred embodiment of the present invention, therefore, also results in the extended crystal lattice spacing in the piezoelectric thin film after ion implantation returning to the length in the stable state before ion implantation and the piezoelectric thin film formed on the support maintaining the crystal lattice spacing before ion implantation.

Furthermore, it is possible in a manufacturing method of a piezoelectric device according to a preferred embodiment of the present invention that the compressive stress film formation step is replaced with a tensile stress film formation step. The tensile stress film formation step is a step in which a tensile stress film for pulling the surface on the ion-implanted side of the piezoelectric substrate is formed on the surface as the stress layer.

The tensile stress film formed on the ion implantation plane side during the tensile stress film formation step in this manufacturing method applies tensile stress to the half of the piezoelectric substrate located on the ion implantation plane side with respect to the center line of the thickness of the piezoelectric substrate. The applied tensile stress pulls the half of the piezoelectric substrate on the ion implantation plane side with respect to the center line and makes this portion contract. As a result, the piezoelectric substrate is relieved from its warped state and becomes substantially flat.

This means that the piezoelectric substrate has a substantially flat shape with reduced warpage while the provisional support is formed on it during the provisional support formation step. Furthermore, the heat treatment in the isolation step expels the implanted ionized element existing in the piezoelectric thin film from the piezoelectric thin film by degasification and corrects the crystallographic strain in the piezoelectric thin film caused by the ion implantation step. These actions cause the extended crystal lattice spacing in the piezoelectric thin film after ion implantation to return to the length in the stable state before ion implantation. The piezoelectric thin film produced in this manufacturing method therefore has stable and satisfactory piezoelectricity.

Additionally, there is no shear stress exerted on the piezoelectric thin film in this manufacturing method because the piezoelectric thin film formed on the support still maintains the crystal lattice spacing before ion implantation.

The manufacturing method of a piezoelectric device in which a tensile stress film is formed as a stress layer is, therefore, also free of the degradation of the piezoelectricity of the piezoelectric thin film and damage to the piezoelectric thin film.

In a method for manufacturing a piezoelectric device according to a preferred embodiment of the present invention, the compressive stress film preferably is formed on the back side of the piezoelectric substrate, which is opposite to the surface on the ion-implanted side, using a material having a smaller coefficient of linear expansion than the piezoelectric substrate and then put under a temperature lower than that at the formation of the compressive stress film during the compressive stress film formation step to confine the surface on the ion-implanted side of the piezoelectric substrate while applying compressive stress to the surface on the implanted side of the piezoelectric substrate. Alternatively this compressive stress film formation step may be a step in which the compressive stress film is formed on the back side of the piezoelectric substrate, which is opposite to the surface on the ion-implanted side, using a material having a larger coefficient of linear expansion than the piezoelectric substrate and then put under a temperature higher than that at the formation of the compressive stress film to confine the surface on the ion-implanted side of the piezoelectric substrate while applying compressive stress to the surface on the implanted side of the piezoelectric substrate.

A method for manufacturing a piezoelectric device according to a preferred embodiment of the present invention preferably includes at least an electrode film formation step. The electrode film formation step is a step of forming an IDT (Interdigital Transducer) electrode film on the piezoelectric thin film formed on the front of the support.

In a method for manufacturing a piezoelectric device according to a preferred embodiment of the present invention, the ion implantation step preferably is carried out after the compressive stress film formation step.

First, a compressive stress film is formed on the back side during the compressive stress film formation step, and this compressive stress film applies compressive stress to the half of the piezoelectric substrate located on the ion-implanted side with respect to the center line of the thickness of the piezoelectric substrate. The applied compressive stress compresses the half of the piezoelectric substrate on the ion-implanted side with respect to the center line and causes this portion to contract. As a result, the piezoelectric substrate is warped with the compressive stress film side curved outwards.

Ions are then implanted in the ion implantation step, and the implanted ionized element widens the crystal lattice spacing of the piezoelectric material in the ion-implanted portion of the piezoelectric substrate. This relieves the piezoelectric substrate from its warped state and makes it substantially flat.

This ensures that the piezoelectric substrate has a substantially flat shape with reduced warpage while it is formed on a supporting substrate during the support formation step, which follows the ion implantation step.

A method for manufacturing a piezoelectric device according to a preferred embodiment of the present invention preferably includes at least a dielectric film formation step. The dielectric film formation step is a step of forming a dielectric film on the piezoelectric thin film to cover the IDT electrode film.

A method for manufacturing a piezoelectric device according to a preferred embodiment of the present invention preferably includes at least a sacrificial layer formation step, an exposure step, and a sacrificial layer removal step.

The sacrificial layer formation step preferably is a step of forming a sacrificial layer in a space defined to later serve as a void layer existing between the piezoelectric thin film and the support. The exposure step is a step of making the sacrificial layer partially exposed on a side of the piezoelectric thin film by etching the piezoelectric crystal thin film to form a hole therethrough. The sacrificial layer removal step is a step of removing the sacrificial layer through the hole.

Piezoelectric devices produced by this manufacturing method have a membrane structure.

One of the advantageous effects of various preferred embodiments of the present invention is to prevent the degradation of the piezoelectricity of the piezoelectric thin film and damage to the piezoelectric thin film.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The following describes the manufacturing method of piezoelectric devices according to Preferred Embodiment 1 of the present invention with reference to drawings. In the following description, a method for manufacturing surface acoustic wave devices is detailed as an illustrative manufacturing method of piezoelectric devices.

Figure 1A:
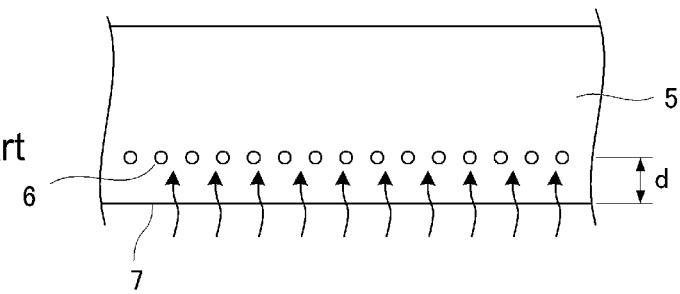
FIGS. 1A-1D are schematic cross-sectional diagrams illustrating the manufacturing steps of a piezoelectric device according to Japanese Unexamined Patent Application Publication No. 2002-534886.
Figure 1B:
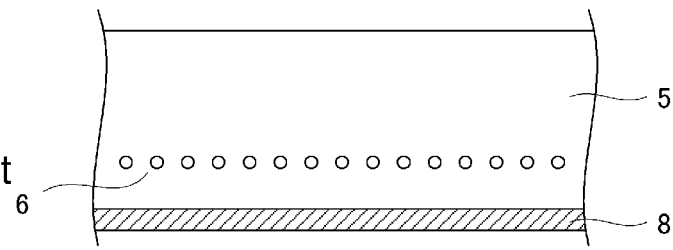
Figure 1C:
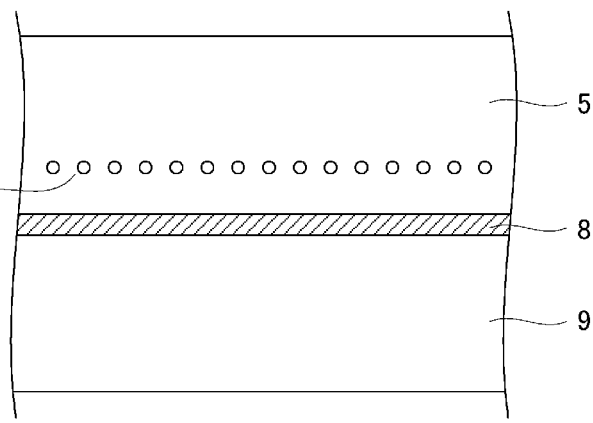
Figure 1D:
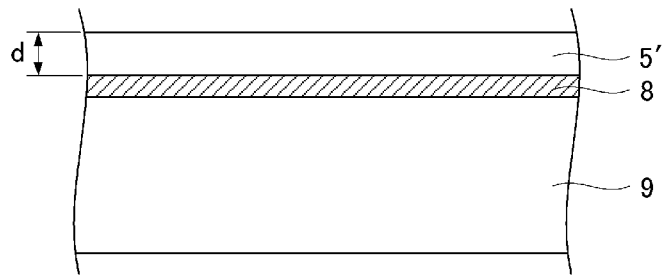
Figure 2:
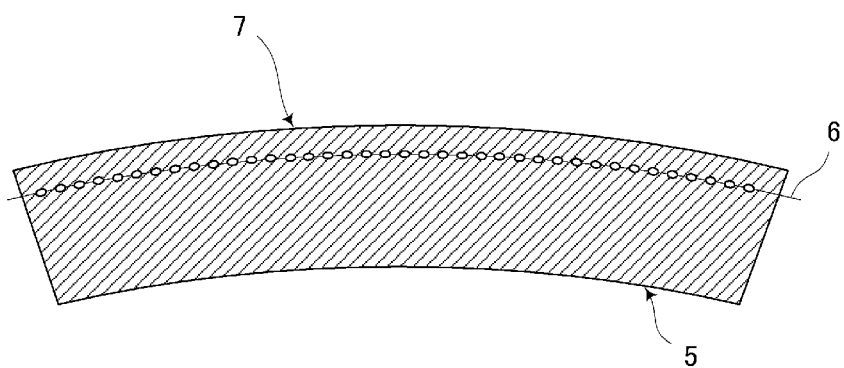
FIG. 2 is a schematic diagram illustrating a warped piezoelectric substrate after an ion implantation step.
Figure 3:
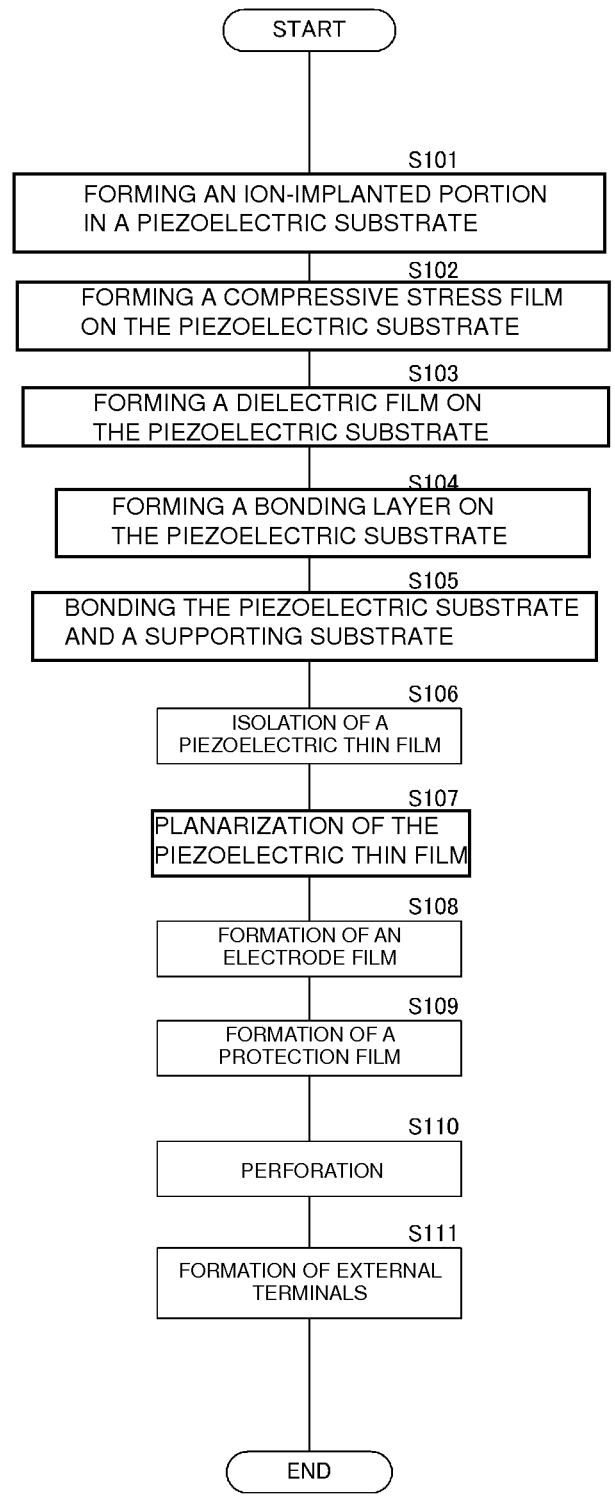
FIG. 3 is a flowchart illustrating the manufacturing method of piezoelectric devices according to Preferred Embodiment 1 of the present invention.

FIG. 3 is a flowchart illustrating the manufacturing method of piezoelectric devices according to Preferred Embodiment 1. FIGS. 4A and 4B and FIGS. 6A to 8B show schematic cross-sectional diagrams illustrating the manufacturing steps of piezoelectric devices according to Preferred Embodiment 1. FIG. 5A is a schematic diagram illustrating a warped piezoelectric single crystal substrate after an ion implantation step, and FIG. 5B is a schematic diagram illustrating the piezoelectric single crystal substrate relieved from its warped state by the action a compressive stress film.

Figure 4A:
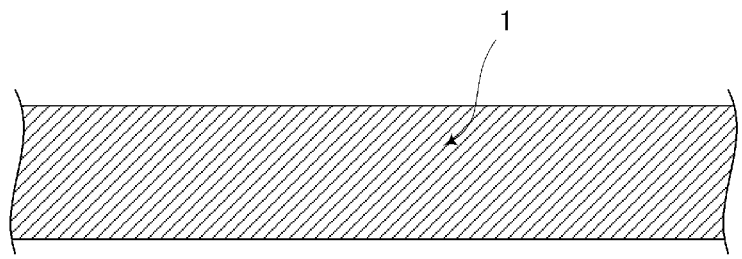
FIGS. 4A and 4B are schematic cross-sectional diagrams illustrating some of the manufacturing steps of piezoelectric devices presented in FIG. 3.
Figure 5A:
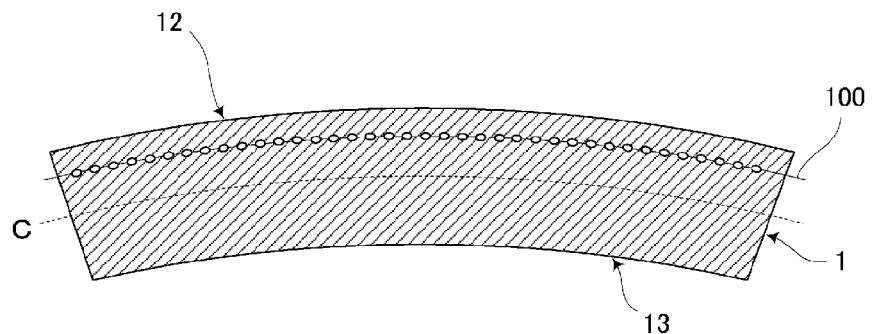
FIG. 5A is a schematic diagram illustrating a warped piezoelectric single crystal substrate after an ion implantation step.
Figure 5B:
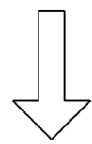
FIG. 5B is a schematic diagram illustrating the piezoelectric single crystal substrate relieved from its warped state by the action a compressive stress film.
Figure 5B:
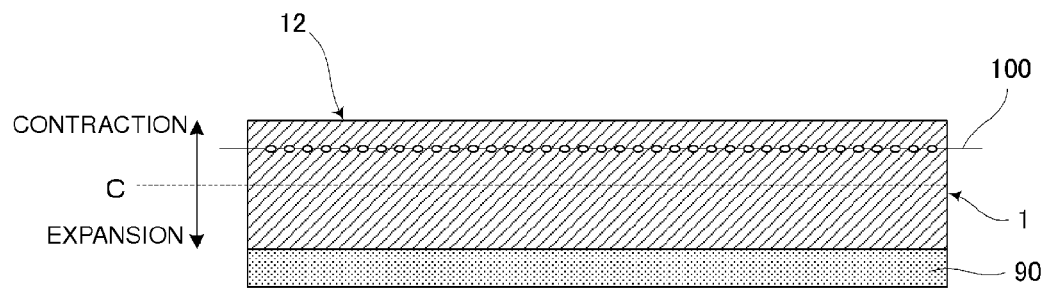
Figure 6A:
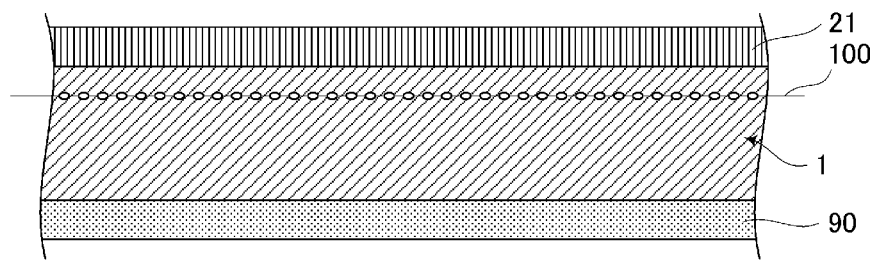
FIGS. 6A-6C are schematic cross-sectional diagrams illustrating some of the manufacturing steps of piezoelectric devices presented in FIG. 3.
Figure 6B:
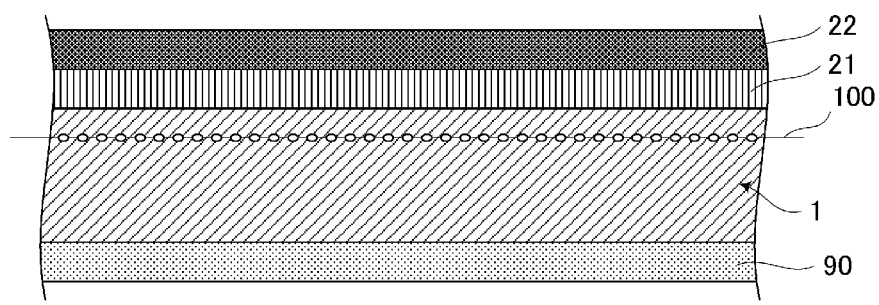
Figure 6C:
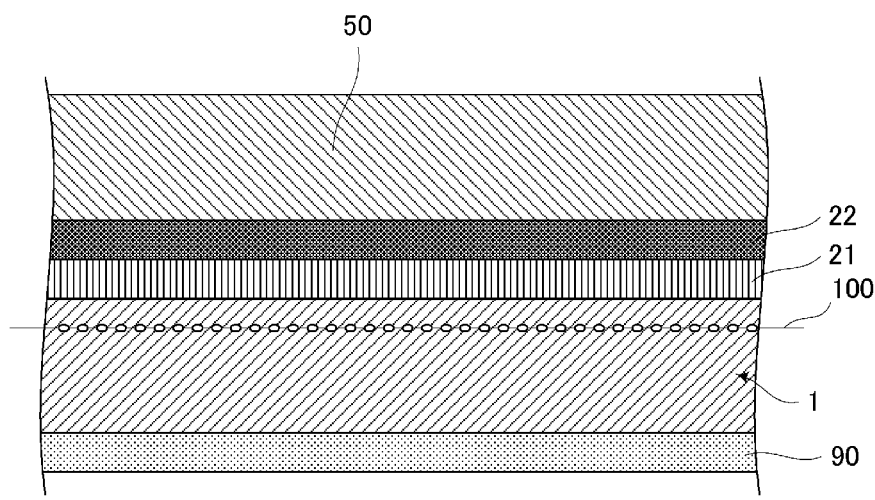

The first step is to prepare a piezoelectric single crystal substrate 1 having a predetermined thickness as illustrated in FIG. 4A. A supporting substrate 50 having a predetermined thickness, illustrated later in FIGS. 6A-6C, is also prepared. The piezoelectric single crystal substrate 1 preferably is a lithium tantalate substrate, and the supporting substrate 50, which corresponds to the support, preferably is a Si substrate. It is not essential that the piezoelectric single crystal substrate 1 be a lithium tantalate substrate; it may be a lithium niobate substrate, a lithium tetraborate substrate, a langasite substrate, or a potassium niobate substrate. Likewise, it is not essential that the supporting substrate 50 be a Si substrate; it may be made of glass or any other ceramic material, quartz, or sapphire or be a piezoelectric single crystal substrate or the like.

Figure 4B:
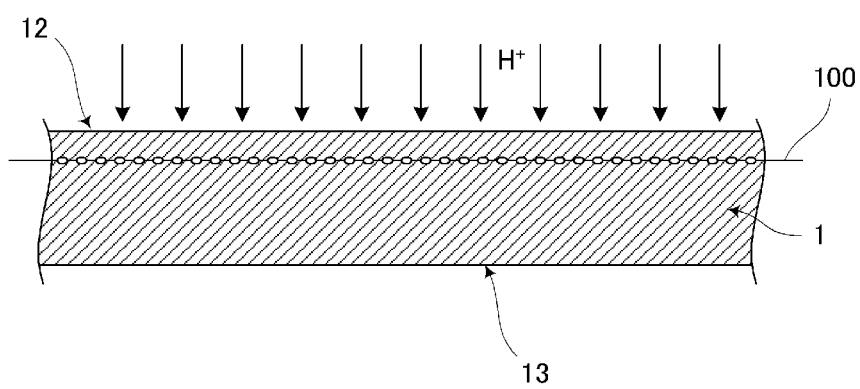

Hydrogen ions are then implanted into the piezoelectric single crystal substrate 1 from the front 12 side such that an ion-implanted portion 100 is formed in the piezoelectric single crystal substrate 1 as illustrated in FIG. 4B (S101 in FIG. 3). When the piezoelectric single crystal substrate 1 is a lithium tantalate substrate, for example, hydrogen ion implantation with an acceleration energy of about 150 KeV and a dose of about $1.0 \times 10^{17}$ atoms/cm$^2$ produces a hydrogen-containing portion at a depth of about 1 μm from the front 12 so as to form the ion-implanted portion 100. This ion-implanted portion 100 is the concentration peak of the ionized element implanted into the piezoelectric single crystal substrate 1. Preferably, the thickness of the piezoelectric single crystal substrate 1 is at least 10 times the depth of the hydrogen-containing portion because otherwise the piezoelectric single crystal substrate 1 becomes excessively warped.

When the raw material of the piezoelectric single crystal substrate 1 is not a lithium tantalate substrate, the conditions of ion implantation are adjusted depending on the specific substrate used.

The ion implantation in this ion implantation step S101 causes the piezoelectric single crystal substrate 1 to be warped with the ion-implanted portion 100 side of the piezoelectric single crystal substrate 1 curved outwards as illustrated in FIG. 5A. This type of warpage occurs because the implanted ionized element causes the crystal lattice spacing of the piezoelectric material to extend in the ion-implanted portion of the piezoelectric single crystal substrate 1.

When the piezoelectric single crystal substrate 1 is in such a warped shape, bonding it to the supporting substrate 50 (see FIG. 6C, which will be described later) results in the piezoelectric material existing on the surface 12 on the ion-implanted portion 100 side adhering to the supporting substrate 50 with its crystal lattice spacing longer than that before ion implantation. Isolation of a piezoelectric thin film 10 after bonding to the supporting substrate 50 therefore causes the crystal lattice spacing in the piezoelectric thin film 10 to be longer than that before ion implantation (see FIG. 7A, which will be described later).

To prevent this, a compressive stress film 90 is formed on the back 13 of the piezoelectric single crystal substrate 1, which is opposite to the surface 12 on the ion-implanted portion 100 side, as illustrated in FIG. 5B (S102 in FIG. 3). The compressive stress film 90 is a film that compresses the surface on the ion-implanted portion 100 side of the piezoelectric single crystal substrate 1. Non-limiting examples of materials used to make the compressive stress film 90 include silicon oxide, silicon nitride, aluminum oxide, aluminum nitride, zinc oxide, and tantalum oxide. The compressive stress film 90 is formed on the back 13 of the piezoelectric single crystal substrate 1, which is opposite to the surface 12 on the ion-implanted portion 100 side, preferably by vapor deposition, sputtering, CVD, or a similar method. Regardless of what film formation method is used, the conditions of film formation, such as materials and film thickness, are selected in a way that the formed film should compress the surface 12 on the ion-implanted portion 100 side of the piezoelectric single crystal substrate 1. Besides this film-formation-based approach, compressive stress can be applied to the surface 12 on the ion-implanted portion 100 side of the piezoelectric single crystal substrate 1 by the following two ways. The first one is to form the compressive stress film 90 on the back 13 of the piezoelectric single crystal substrate 1 using a material having a smaller coefficient of linear expansion than the piezoelectric single crystal substrate 1 and then form the later-described support on the surface 12 on the ion-implanted side (see S105 in FIG. 3 and FIG. 6C for the present preferred embodiment) at a temperature lower than that at the formation of the compressive stress film 90. The second one is to form the compressive stress film 90 on the back 13 of the piezoelectric single crystal substrate 1 using a material having a larger coefficient of linear expansion than the piezoelectric single crystal substrate 1 and then form the later-described support on the surface 12 on the ion-implanted side (see S105 in FIG. 3 and FIG. 6C for the present preferred embodiment) at a temperature higher than that at the formation of the compressive stress film 90. In the present preferred embodiment, the first one is preferably used.

Once the compressive stress film 90 is formed on the back 13 during the compressive stress film formation step S102, the compressive stress produced by the compressive stress film 90 is applied to the half of the piezoelectric single crystal substrate 1 located on the ion-implanted portion 100 side with respect to the center line C of the thickness of the piezoelectric single crystal substrate 1. The applied compressive stress compresses the half of the piezoelectric single crystal substrate 1 on the ion-implanted portion 100 side with respect to the center line C and causes this portion to contract. As a result, the piezoelectric single crystal substrate 1 is relieved from its warped state and becomes substantially flat.

The compressive stress produced by the compressive stress film 90 formed in the compressive stress film formation step S102 is not enough to make the piezoelectric single crystal substrate 1 absolutely flat. However, it is enough to reduce the amount of warpage, and the reduced amount of warpage results in the crystal lattice spacing in the piezoelectric thin film 10 after the heating step S106, which will be described later, being closer to that before ion implantation than without reduction of the amount of warpage.

A dielectric film 21 is then formed on the surface 12 on the ion-implanted portion 100 side of the piezoelectric single crystal substrate 1 as illustrated in FIG. 6A (S103 in FIG. 3). Non-limiting examples of materials used to make the dielectric film 21 include silicon oxide, silicon nitride, aluminum oxide, and aluminum nitride. The dielectric film 21 is formed preferably by vapor deposition, sputtering, CVD, or a similar method. A structure, material, and thickness of the dielectric film 21 appropriate for the desired physical properties of the surface acoustic wave devices are selected.

Forming the dielectric film 21 without carrying out the compressive stress film formation step S102 would lead to the piezoelectric material existing on the surface 12 on the ion-implanted portion 100 side coming into contact with the dielectric film with its crystal lattice spacing longer than that before ion implantation. The later-described heating step S106 for the removal of the implanted ionized element by degasification or a similar treatment is expected to make the extended crystal lattice spacing of the piezoelectric thin film 10 after ion implantation return to that before ion implantation, but the dielectric film 21 produces a force against it. This is the reason that in the present preferred embodiment, the dielectric film 21 preferably is formed after the compressive stress film formation step S102 is carried out. The dielectric film 21 formed in this step S103 can be replaced with some kind of metal film, and this step 103 and the later-described step 104 can be omitted by bonding the support 50 directly to the surface on the ion-implanted portion 100 side of the piezoelectric single crystal substrate 1. In these cases it is also necessary to complete the compressive stress film formation step S102 before forming the metal film or carrying out the bonding operation.

A bonding film 22 to be bonded to the supporting substrate 50 is then formed on the surface of the dielectric film 21 as illustrated in FIG. 6B (S104 in FIG. 3). The surface of the bonding film 22 is then polished and planarized. The bonding film 22 is preferably made of an inorganic material, and non-limiting examples of materials used to make it include silicon oxide, silicon nitride, aluminum oxide, and aluminum nitride. The bonding film 22 is formed preferably by vapor deposition, sputtering, CVD, or a similar method. The portion including the supporting substrate 50, the dielectric film 21, and the bonding film 22 corresponds to the support referred to in the description of various preferred embodiments of the present invention.

The supporting substrate 50 is then bonded to the surface of the bonding film 22 on the piezoelectric single crystal substrate 1 as illustrated in FIG. 6C (S105 in FIG. 3).

This bonding operation can be done by direct bonding techniques such as bonding after activation or hydrophilization, or bonding using interdiffusion through a metal layer. Although in the present preferred embodiment, the supporting substrate 50 is bonded to the piezoelectric single crystal substrate 1, it is possible in practical implementation that the supporting substrate 50 is formed on the piezoelectric single crystal substrate 1 by film formation or a similar process.

The joined body of the piezoelectric single crystal substrate 1 and the supporting substrate 50 illustrated in FIG. 6C is then heated (preferably to about 500° C. in this preferred embodiment) to initiate isolation at the ion-implanted portion 100 as the isolation plane (S106 in FIG. 3). The heating temperature in the isolation step S106 can be lowered with heating under reduced pressure.

Figure 7A:
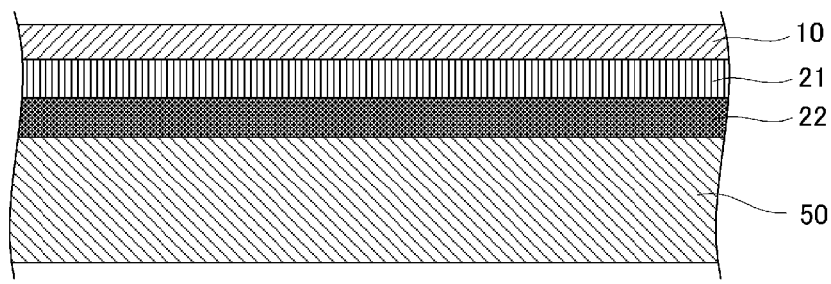
FIGS. 7A-7C are schematic cross-sectional diagrams illustrating some of the manufacturing steps of piezoelectric devices presented in FIG. 3.

After the isolation step S106, the dielectric film 21 on the supporting substrate 50 includes a single-crystal piezoelectric thin film 10 on its surface as illustrated in FIG. 7A.

The piezoelectric single crystal substrate 1 has a substantially flat shape with reduced warpage while it is bonded to the supporting substrate 50 during the bonding step S105. Furthermore, heating to about 500° C. in the isolation step S106 expels the implanted ionized element existing in the piezoelectric thin film 10 (hydrogen in the present preferred embodiment) from the piezoelectric thin film 10 by degasification and corrects the crystallographic strain in the piezoelectric thin film 10 caused by the ion implantation step S101. These actions make the extended crystal lattice spacing in the piezoelectric thin film 10 after ion implantation return to the length in the stable state before ion implantation. The piezoelectric thin film 10 produced in the present preferred embodiment therefore has stable and satisfactory piezoelectricity.

Additionally, there is no shear stress exerted on the piezoelectric thin film 10 in the present preferred embodiment because the piezoelectric thin film 10 located on the supporting substrate 50 still maintains the crystal lattice spacing before ion implantation.

The manufacturing method of piezoelectric devices according to the present preferred embodiment is therefore free of the degradation of the piezoelectricity of the piezoelectric thin film 10 and damage to the piezoelectric thin film 10.

In addition to this, preferably the piezoelectric thin film 10 is a single-crystal thin film and thus has higher piezoelectricity than polycrystalline thin films formed by sputtering, vapor deposition, CVD, or a similar method. The crystal orientation of the piezoelectric thin film 10 is inherited from the piezoelectric single crystal substrate 1; the use of a piezoelectric single crystal substrate 1 having a crystal orientation right for the desired characteristics of the piezoelectric devices leads to a piezoelectric thin film 10 being formed with a crystal orientation right for the characteristics. Furthermore, the formation process of the single-crystal thin film preferably includes ion implantation, bonding, and isolation, and thus more than one piezoelectric thin film 10 can be formed from one piezoelectric single crystal substrate 1; the single-crystal piezoelectric material can be conserved.

The surface of the isolated piezoelectric thin film 10 is then polished and planarized by CMP or a similar treatment (S107 in FIG. 3). The resulting surface roughness is preferably about 0.5 nm or less when measured as an arithmetic mean roughness Ra, for example.

Figure 7B:
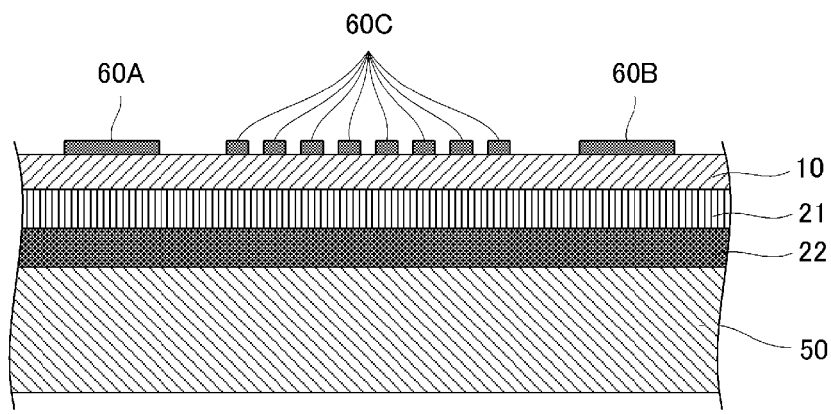

The next step is to form upper electrodes 60A and 60B and an IDT (Interdigital Transducer) electrode 60C having a predetermined thickness on the surface of the piezoelectric thin film 10 from Al (aluminum) or a similar material as illustrated in FIG. 7B (S108 in FIG. 3). The upper electrodes 60A and 60B and the IDT electrode 60C correspond to the electrode film referred to in description of various preferred embodiments of the present invention.

It is not essential that the electrodes 60A to 60C be made of Al; a layer of or a laminate consisting of more than one layer of Al, W, Mo, Ta, Hf, Cu, Pt, Ti, Au, and similar materials may be used depending on the desired specifications of the devices.

Figure 7C:
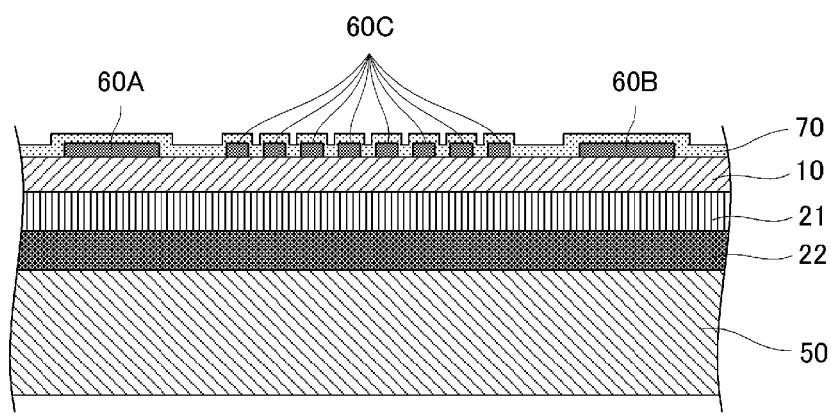

An insulating film 70 is then formed on the surface of the piezoelectric thin film 10 and the electrodes 60A to 60C as illustrated in FIG. 7C to protect these piezoelectric thin film 10 and electrodes 60A to 60C (S109 in FIG. 3).

Figure 8A:
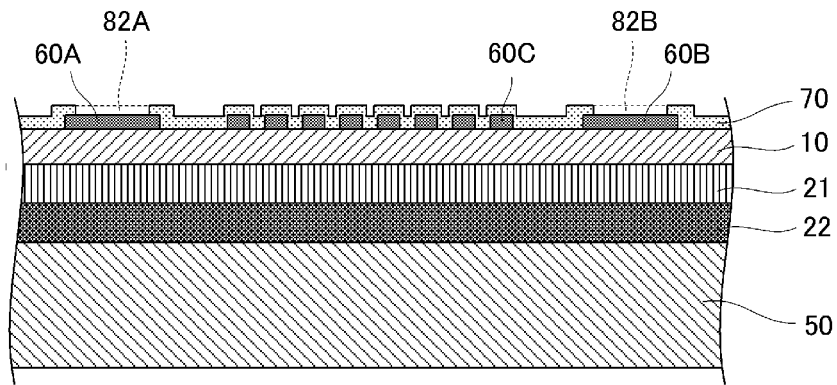
FIGS. 8A and 8B show schematic cross-sectional diagrams illustrating some of the manufacturing steps of piezoelectric devices presented in FIG. 3.

The regions of the insulating film 70 at which the upper electrodes 60A and 60B are to be exposed are then removed by etching or a similar process, forming openings 82A and 82B as illustrated in FIG. 8A (S110 in FIG. 3).

Figure 8B:
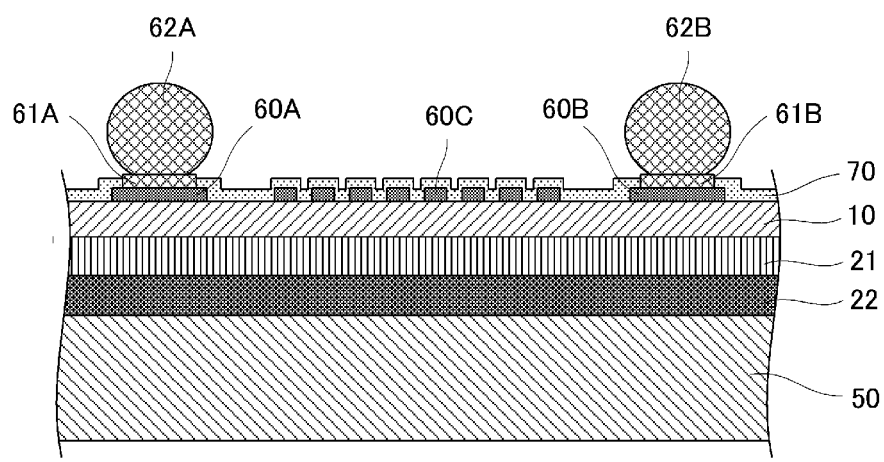

External terminals are then formed as illustrated in FIG. 8B (S111 in FIG. 3). More specifically, bump pads 61A and 61B are formed on the upper electrodes 60A and 60B, and bumps 62A and 62B are formed on these bump pads 61A and 61B.

Finally, the thin-film piezoelectric devices formed on the supporting substrate 50 are diced into separate devices in a dicing step, and each device is packaged using a molding die. As thin-film piezoelectric devices (surface acoustic wave resonators) are fabricated in this way, a batch of thin-film piezoelectric devices can be simultaneously produced. The use of the present preferred embodiment, in which a batch of thin-film piezoelectric devices can be simultaneously produced, therefore significantly reduces the manufacturing cost of thin-film piezoelectric devices.

Table 1 shows some measured characteristics of a surface acoustic wave resonator according to the present preferred embodiment, obtained in the way described above, and those of a surface acoustic wave resonator prepared as a comparative example of the surface acoustic wave resonators according to the present preferred embodiment. The surface acoustic wave resonators as a comparative example differed from those according to the present preferred embodiment in that their manufacturing steps did not include the step of forming a compressive stress film 90 on the back 13 of the piezoelectric single crystal substrate 1; their manufacturing methods and configurations were the same in all other respects.

TABLE 1

| Characteristics of the resonator | | |
|---|---|---|
|  | Impedance ratio (dB) | Fractional bandwidth (%) |
| A resonator without a compressive stress film | 72.4 | 3.67 |
| A resonator with a compressive stress film | 84.1 | 4.71 |

As mentioned above, the surface acoustic wave resonator indicated in the upper row of Table 1, a comparative example, was fabricated by forming a piezoelectric thin film 10 on a supporting substrate 50 with no compressive stress applied to the surface 12 on the ion implantation plane side of a piezoelectric single crystal substrate 1. The fabrication steps of the surface acoustic wave resonator in the lower row of Table 1, which is according to the present preferred embodiment, included forming a silicon nitride film with a thickness of about 250 nm on the back 13 of a piezoelectric single crystal substrate 1 by sputtering as the compressive stress film 90 to make the piezoelectric single crystal substrate 1 flat. The amount of warpage of the surface acoustic wave resonator indicated in the upper row of Table 1, a comparative example, was about 220 μm per 80 mm, whereas that of the surface acoustic wave resonator in the lower row of Table 1, which is according to the present preferred embodiment, was improved to about 20 μm per 80 mm by the formation of the compressive stress film 90.

Table 1 clearly shows that comparing resonators with or without a compressive stress film 90, the characteristics of the resonators with a compressive stress film 90 are better in terms of piezoelectricity. This appears to be because although a piezoelectric thin film 10 formed on a supporting substrate 50 with an extended crystal lattice spacing in the piezoelectric thin film 10 would have a reduced piezoelectricity, forming a piezoelectric thin film 10 on a supporting substrate 50 in the presence of a compressive stress film 90, which corrects this extension in crystal lattice spacing in the piezoelectric thin film 10, causes the piezoelectric thin film 10 to regain its piezoelectricity.

The following describes the manufacturing method of piezoelectric devices according to Preferred Embodiment 2 of the present invention with reference to FIGS. 9 to 12B. In the following description, a method for manufacturing surface acoustic wave devices is detailed as an illustrative manufacturing method of piezoelectric devices.

Figure 9:
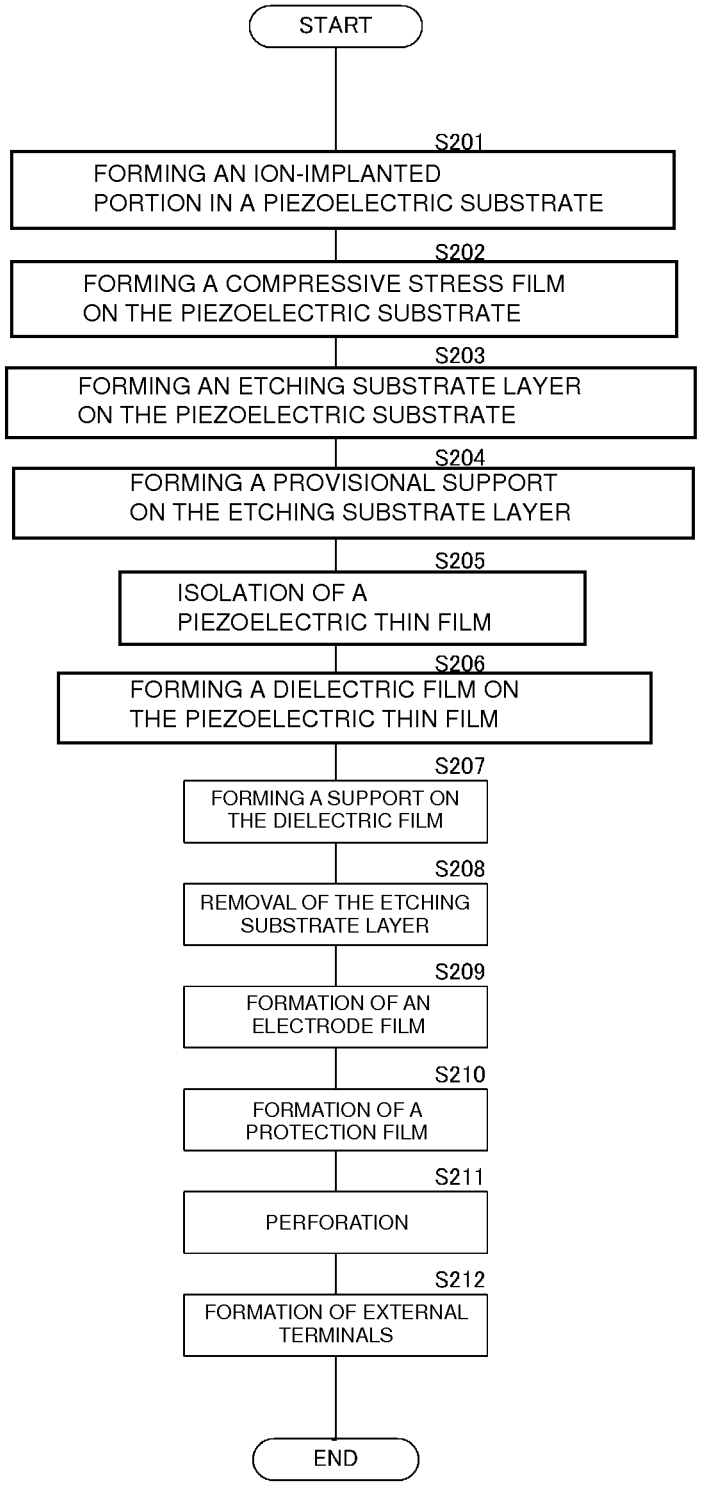
FIG. 9 is a flowchart illustrating the manufacturing method of piezoelectric devices according to Preferred Embodiment 2 of the present invention.
Figure 10:
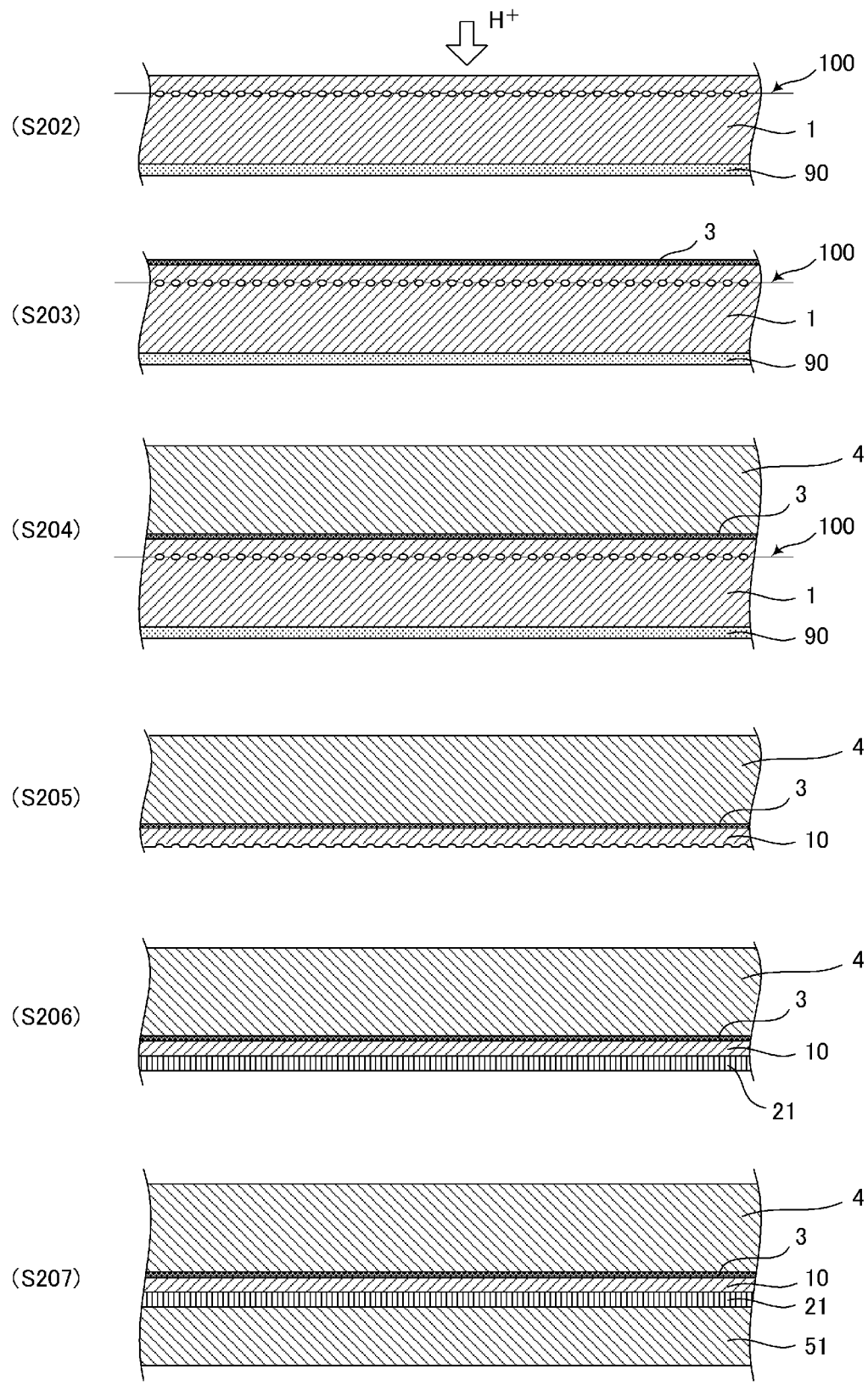
FIG. 10 shows schematic cross-sectional diagrams illustrating some of the manufacturing steps of piezoelectric devices presented in FIG. 9.
Figure 11:
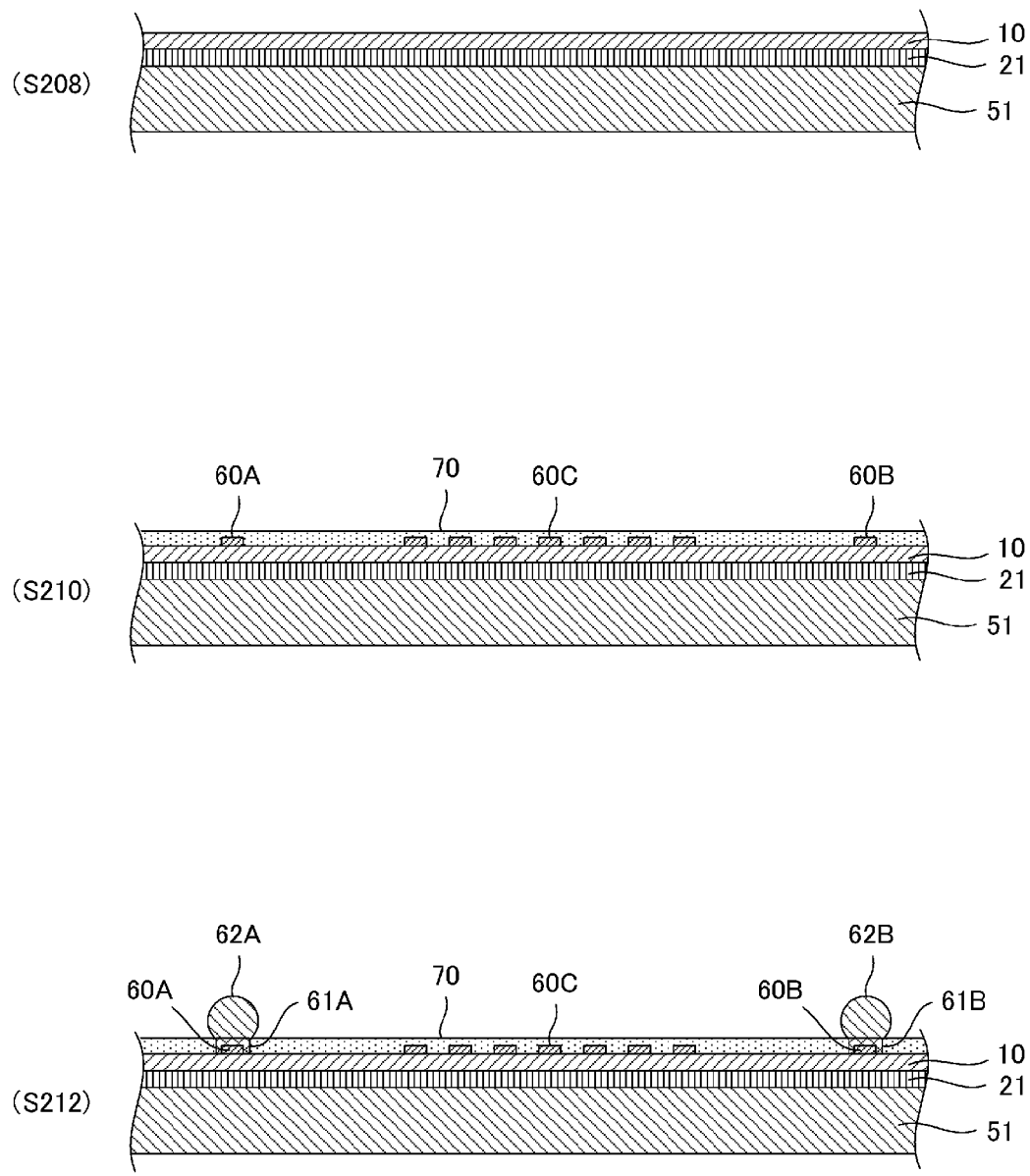
FIG. 11 shows schematic cross-sectional diagrams illustrating some of the manufacturing steps of piezoelectric devices presented in FIG. 9.

FIG. 9 is a flowchart illustrating the manufacturing method of piezoelectric devices according to Preferred Embodiment 2. FIGS. 10 and 11 show schematic cross-sectional diagrams illustrating the manufacturing steps of piezoelectric devices presented in FIG. 9. Preferred Embodiment 2 is different from Preferred Embodiment 1 in that it includes a provisional support formation step; the procedures up to the compressive stress film formation step are the same.

After the compressive stress film formation step (S202 in FIGS. 9 and 10), an etching substrate layer formation step is carried out to place an etching substrate layer 3 on the surface on the ion-implanted side of the piezoelectric single crystal substrate 1 (S203 in FIGS. 9 and 10). The etching substrate layer 3 is made of any material that can be etched in the later provisional supporting substrate removal step with sufficient selectivity against the piezoelectric thin film 10 and the supporting material. Non-limiting examples of materials that can be used include inorganic materials such as ZnO, SiO$_2$, and AlN, metallic materials such as Cu, Al, and Ti, and organic materials such as polyimides, and this layer can be something like a multilayer film containing these materials.

It is also possible not to form the etching substrate layer 3.

A provisional support formation step is then carried out to form a provisional support 4 on the etching substrate layer 3 placed on the piezoelectric single crystal substrate 1 (S204 in FIGS. 9 and 10). In the manufacturing method of piezoelectric devices according to the present preferred embodiment, the piezoelectric single crystal substrate 1 has a substantially flat shape with reduced warpage while the provisional support 4 is formed on it during this provisional support formation step. The provisional support 4 serves as a component of a provisional supporting substrate together with the etching substrate layer 3. The provisional supporting substrate, including the etching substrate layer 3 and the provisional support 4, may be made of any material, and it is preferred to select a material that exerts a smaller amount of thermal stress on the interface with the piezoelectric single crystal substrate (piezoelectric thin film 10) than the support 51, preferably substantially no thermal stress.

In this preferred embodiment, the material of the provisional support 4 preferably is of the same kind as that of the piezoelectric single crystal substrate 1, i.e., a lithium tantalate substrate, and the material of the etching substrate layer 3 is a laminate of a Cu film and a SiO$_2$ film each formed by sputtering. The coefficient of linear expansion of the provisional support 4 alone and that of the piezoelectric single crystal substrate 1 alone are therefore equal, and this makes the thermal stress acting on the interface between the provisional supporting substrate, which is a composite article including the etching substrate layer 3 and the provisional support 4, and the piezoelectric single crystal substrate 1 (piezoelectric thin film 10) substantially zero.

Although the coefficient of linear expansion of the etching substrate layer 3 is different from that of lithium tantalate substrates, the practice of placing a highly ductile material (e.g., a metallic material) such as the Cu film mentioned above directly on the piezoelectric single crystal substrate 1 and forming the etching substrate layer 3 with a minimum required thickness reduces the thermal stress on the interface with the piezoelectric single crystal substrate 1 (piezoelectric thin film 10).

After this step S204, an isolation step is carried out in the same way as in Preferred Embodiment 1 to heat the piezoelectric single crystal substrate 1 to initiate isolation at the ion-implanted portion 100, i.e., the concentration peak of the element implanted into the piezoelectric single crystal substrate 1, as the isolation plane (S205 in FIGS. 9 and 10). As a result, the extended crystal lattice spacing in the piezoelectric thin film 10 after ion implantation returns to the length in the stable state before ion implantation.

A dielectric film 21 is then formed on the piezoelectric thin film 10 in the same way as in Preferred Embodiment 1 (S206 in FIGS. 9 and 10), and a support formation step is carried out to form a support 51 on this dielectric film (S207 in FIGS. 9 and 10). This means that in the manufacturing method of piezoelectric devices according to the present preferred embodiment the piezoelectric thin film 10 formed on the support 51 also still maintains the crystal lattice spacing before ion implantation. This support formation step may be performed by any method that can be carried out at the annealing temperature or lower, preferably at the isolation temperature or lower.

The support 51 serves as a component of a supporting substrate together with the dielectric film 21. Unlike that of the provisional supporting substrate described above, the material of the supporting substrate, which includes the dielectric film 21 and the supporting substrate 51, may be of any desired coefficient of linear expansion and can be selected regardless of the thermal stress that acts on the interface with the piezoelectric single crystal substrate 1 (piezoelectric thin film 10) during the heating step. The dielectric film 21 and the support 51 can therefore be made of a material having a significantly smaller coefficient of linear expansion than the piezoelectric thin film 10, thereby leading to greatly improved temperature-frequency characteristics of the surface acoustic wave devices. It is also possible to make the heat dissipation and electric power handling capabilities of the surface acoustic wave devices better by using a highly thermally conductive material to form the dielectric film 21 and the support 51. Furthermore, the manufacturing cost of the surface acoustic wave devices can be reduced by using an inexpensive material and a low-cost method to form the dielectric film 21 and the support 51.

The next step is a provisional supporting substrate removal step for removing the provisional supporting substrate, which includes the etching substrate layer 3 and the provisional support 4 (S208 in FIGS. 9 and 11). This step may be performed by any method that can be carried out at the annealing temperature or lower, preferably at the isolation temperature or lower.

The provisional supporting substrate, which includes the etching substrate layer 3 and the provisional support 4, is removed by wet-etching or dry-etching the etching substrate layer 3. In general, wet etching is used when the etching substrate layer 3 is made of an inorganic material or a metallic material, and dry etching is used when this layer is made of an organic material. This prevents unnecessary stress or impact on the piezoelectric thin film 10 during the removal of the etching substrate layer 3 and the provisional support 4 so as to prevent defects from occurring in the piezoelectric thin film 10. Conveniently, the provisional support 4 separated from the etching substrate layer 3 can be later reused to fabricate subsequent sets of surface acoustic wave devices.

Finally, electrode formation and some subsequent steps are carried out preferably in the same way as in Preferred Embodiment 1 (S209 to S212 in FIGS. 9 and 11), followed by dicing and molding steps, to complete the surface acoustic wave devices.

As can be seen from the foregoing, surface acoustic wave devices obtained in Preferred Embodiment 2 have the piezoelectric thin film 10 turned inside out with respect to ones fabricated in Preferred Embodiment 1. This structure of surface acoustic wave devices, in which the piezoelectric thin film 10 of devices fabricated in Preferred Embodiment 1 is turned inside out, has an advantageous effect, and the following describes this advantageous effect of a preferred embodiment of the present invention with reference to FIGS. 12A and 12B.

Figure 12A:
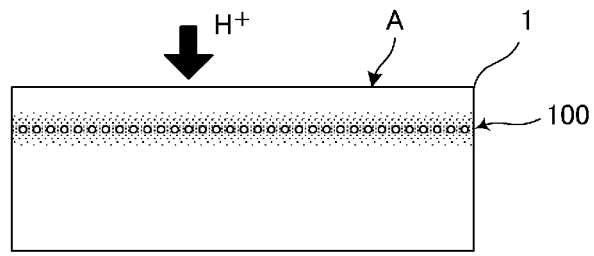
FIG. 12A is a schematic diagram illustrating a surface acoustic wave device fabricated in Preferred Embodiment 1.
Figure 12A:
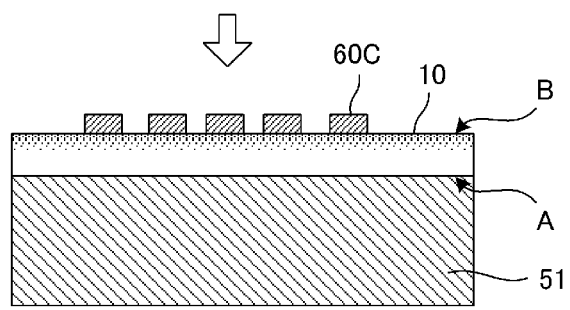
Figure 12B:
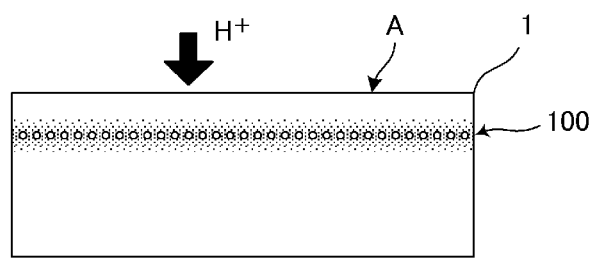
FIG. 12B is a schematic diagram illustrating a surface acoustic wave device fabricated in Preferred Embodiment 2.
Figure 12B:
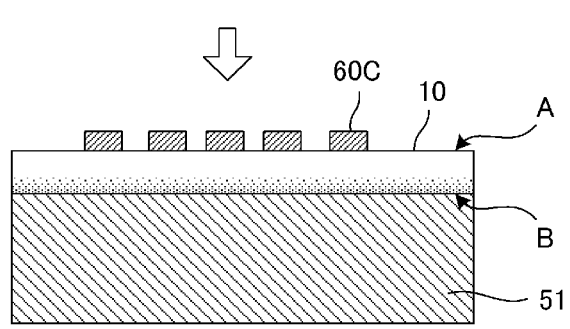

FIG. 12A is a schematic diagram illustrating a surface acoustic wave device fabricated in Preferred Embodiment 1, and FIG. 12B is a schematic diagram illustrating a surface acoustic wave device fabricated in Preferred Embodiment 2. It is common to both that ions are implanted into a piezoelectric single crystal substrate 1 from an ion implantation plane A to form an ion-implanted portion 100 in an ion implantation step and then a piezoelectric thin film 10 is isolated from the piezoelectric single crystal substrate 1 at the ion-implanted portion 100 as the isolation plane B. In Preferred Embodiment 1, however, a supporting substrate is formed on the ion implantation plane A, and the functional electrode 60C of the device is formed on the isolation plane B of the piezoelectric thin film 10. In Preferred Embodiment 2, a provisional supporting substrate is formed on the ion implantation plane A, a supporting substrate is then formed on the isolation plane B, and the functional electrode 60C of the device is formed on the ion implantation plane A after the provisional supporting substrate is removed.

A piezoelectric thin film 10 formed by the method in which the piezoelectric thin film 10 is isolated from a piezoelectric single crystal substrate 1 at an ion-implanted portion 100 as the isolation plane regains its crystallinity and piezoelectricity during the heating step, but inevitably contains some amount of residual hydrogen ions. The density of residual hydrogen ions is high in the region that forms the ion-implanted portion 100 in the piezoelectric single crystal substrate 1, or in the vicinity of the isolation plane B on the piezoelectric thin film 10, and low in the vicinity of the ion implantation plane A. As there is a tendency for the local piezoelectricity to remain unaffected with decreasing density of residual hydrogen ions in the region, the piezoelectricity is affected to a greater extent in the vicinity of the isolation plane B and to a lesser extent in the vicinity of the ion implantation plane A. Surface acoustic wave devices fabricated in the present preferred embodiment therefore have even better device characteristics than ones fabricated in Preferred Embodiment 1 because they have their functional electrode 60C on the ion implantation plane A, near which the decrease in piezoelectricity is small.

The following describes the manufacturing method of piezoelectric devices according to Preferred Embodiment 3 with reference to drawings. In the following description, a method for manufacturing surface acoustic wave devices is detailed as an illustrative manufacturing method of piezoelectric devices.

Figure 13:
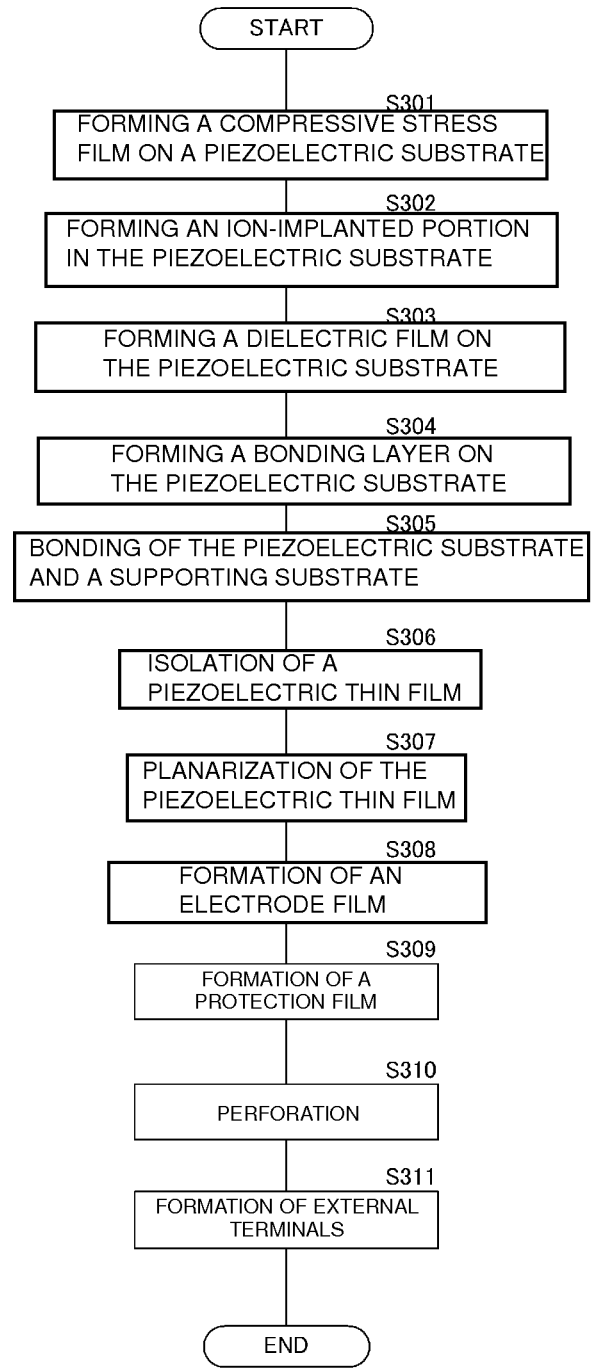
FIG. 13 is a flowchart illustrating the manufacturing method of piezoelectric devices according to Preferred Embodiment 3 of the present invention.
Figure 14A:
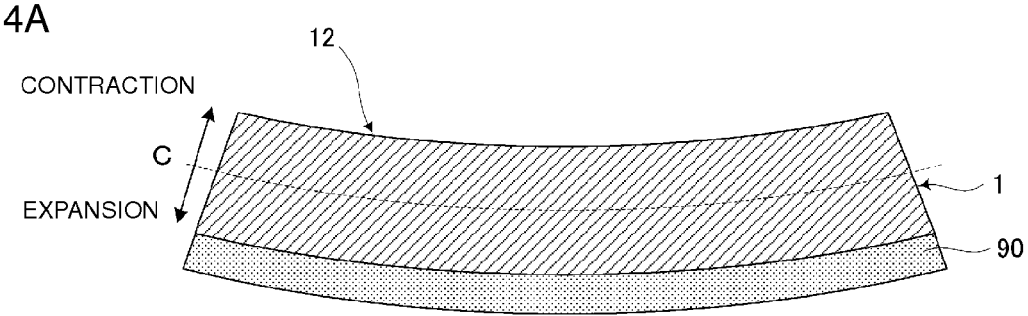
FIG. 14A is a schematic diagram illustrating a piezoelectric single crystal substrate warped by the action of a compressive stress film.
Figure 14B:
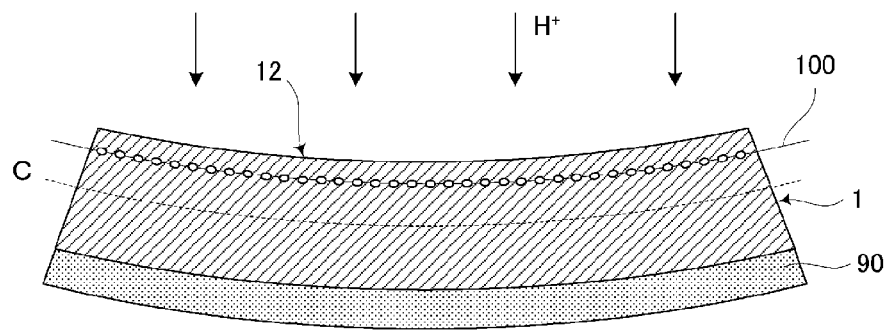
FIG. 14B is a schematic diagram illustrating ions implanted into the piezoelectric single crystal substrate warped by the action of a compressive stress film; the ions are implanted from the front of the piezoelectric substrate.
Figure 14C:
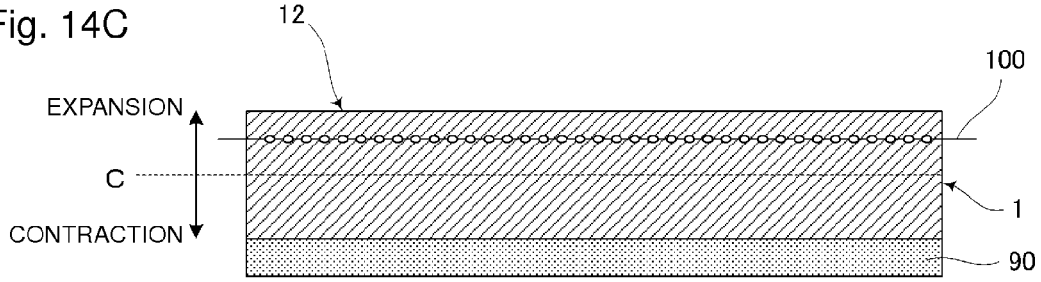
FIG. 14C is a schematic diagram illustrating the piezoelectric single crystal substrate after the ion implantation step; the piezoelectric substrate is relieved from its warped state.

FIG. 13 is a flowchart illustrating the manufacturing method of piezoelectric devices according to Preferred Embodiment 3. FIG. 14A is a schematic diagram illustrating a piezoelectric single crystal substrate warped by the action of a compressive stress film. FIG. 14B is a schematic diagram illustrating ions implanted into the piezoelectric single crystal substrate warped by the action of a compressive stress film; the ions are implanted from the front of the piezoelectric substrate. FIG. 14C is a schematic diagram illustrating the piezoelectric single crystal substrate after the ion implantation step; the piezoelectric substrate is relieved from its warped state.

The manufacturing method of piezoelectric devices according to the present preferred embodiment is different from that described as Preferred Embodiment 1 in that the compressive stress film formation step precedes the ion implantation step. This means that S303 to S311 in FIG. 13 are the same as S103 to S111 in FIG. 3 detailed in Preferred Embodiment 1, respectively.

More specifically, the first step is to form a compressive stress film 90 on the back 13 in the compressive stress film formation step S301. The formed compressive stress film 90 applies a compressive stress acting in the piezoelectric single crystal substrate 1 to the front 12 side of the piezoelectric single crystal 1 (see FIG. 14A). The applied compressive stress compresses the half of the piezoelectric single crystal substrate 1 on the surface 12 side with respect to the center line C and causes this portion to contract. As a result, the piezoelectric single crystal substrate 1 is warped with the compressive stress film 90 side curved outwards.

Ions are then implanted in the ion implantation step S302 (see FIG. 14B), and the implanted ionized element widens the crystal lattice spacing of the piezoelectric material in the ion-implanted portion of the piezoelectric single crystal substrate 1. This relieves the piezoelectric single crystal substrate 1 from its warped state and makes it substantially flat (see FIG. 14C).

The piezoelectric single crystal substrate 1 therefore has a flat shape while it is bonded to a supporting substrate 50 during the bonding step S305. Furthermore, heating to about 500° C. in the isolation step S306 expels the implanted ionized element existing in the resulting piezoelectric thin film 10 (for example, hydrogen in the present preferred embodiment) from the piezoelectric thin film 10 by degasification and corrects the crystallographic strain in the piezoelectric thin film 10 caused by the ion implantation step S302. These actions make the extended crystal lattice spacing in the piezoelectric thin film after ion implantation return to the length in the stable state before ion implantation.

The manufacturing method of piezoelectric devices according to the present preferred embodiment therefore has similar effects to that according to Preferred Embodiment 1.

The following describes the manufacturing method of piezoelectric devices according to Preferred Embodiment 4 with reference to drawings. In the following description, a method for manufacturing boundary acoustic wave devices is detailed as an illustrative manufacturing method of piezoelectric devices.

Figure 15:
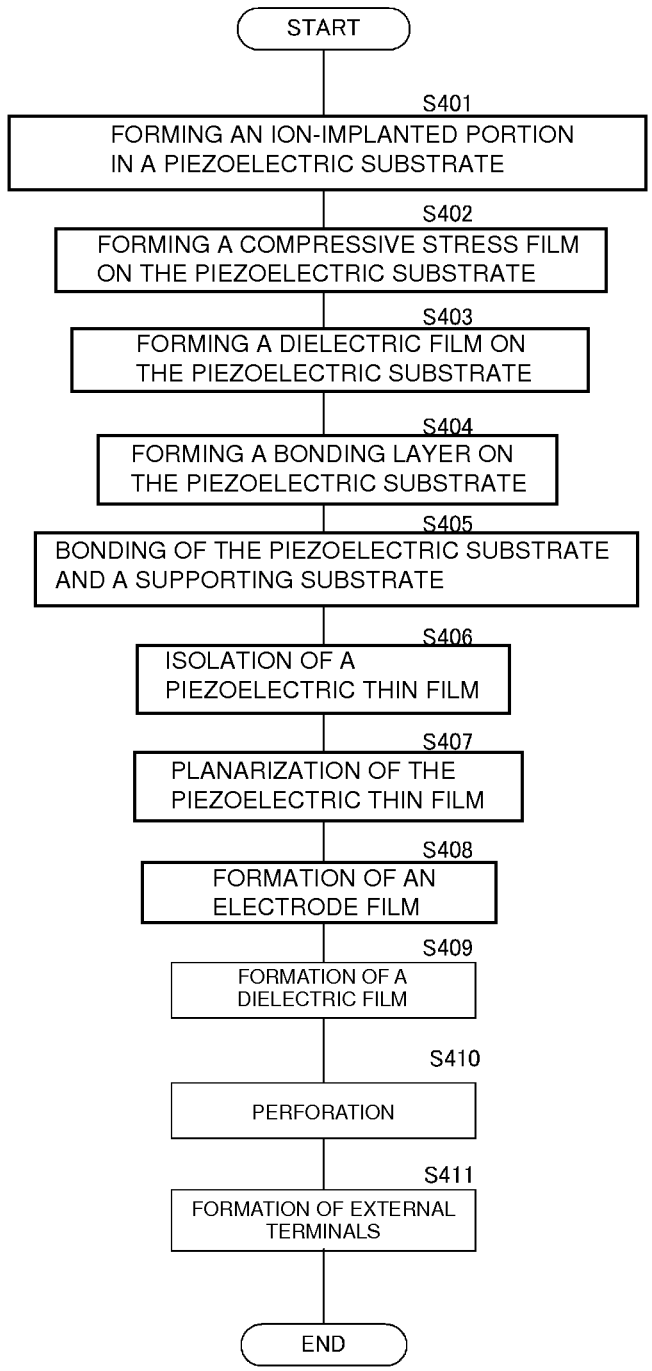
FIG. 15 is a flowchart illustrating the manufacturing method of piezoelectric devices according to Preferred Embodiment 4 of the present invention.
Figure 16:
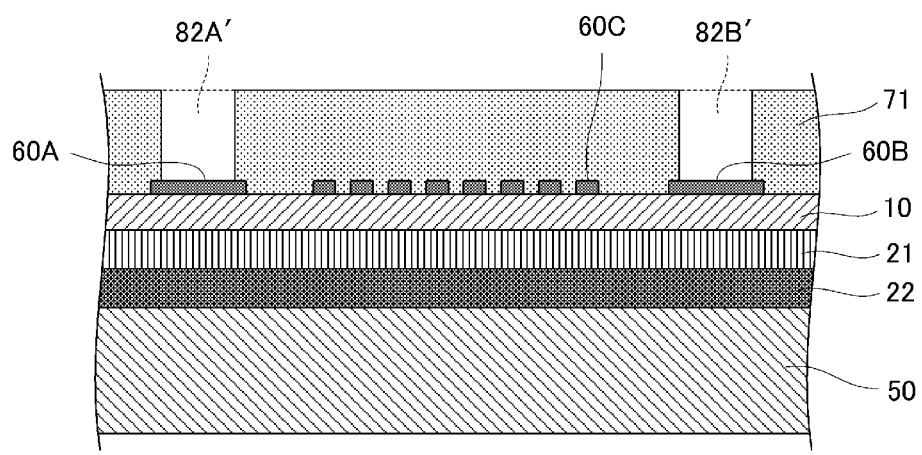
FIG. 16 is a schematic cross-sectional diagram illustrating one of the manufacturing steps of piezoelectric devices presented in FIG. 15.

FIG. 15 is a flowchart illustrating the manufacturing method of piezoelectric devices according to Preferred Embodiment 4. FIG. 16 is a schematic cross-sectional diagram illustrating one of the manufacturing steps of piezoelectric devices according to Preferred Embodiment 4.

The manufacturing method of piezoelectric devices according to the present preferred embodiment is similar to that described as Preferred Embodiment 1 but includes a step of forming a dielectric film 71 (S409 in FIG. 15) instead of the step of forming an insulating film 70 (S109 in FIG. 3). This means that S401 to S408, S410, and S411 in FIG. 15 are preferably the same as S101 to S108, S110, and S111 in FIG. 3 detailed in Preferred Embodiment 1, respectively.

As with the above ones, the present preferred embodiment includes the following steps: a compressive stress film 90 is formed in the compressive stress formation step S402 to relieve the piezoelectric single crystal substrate 1 from its warped state, the flat piezoelectric single crystal 1 is bonded to a supporting substrate 50 in the bonding step S405, and then isolation is initiated by heating in the isolation step S406.

The manufacturing method of piezoelectric devices according to the present preferred embodiment therefore has similar effects to that according to Preferred Embodiment 1.

The following describes the manufacturing method of piezoelectric devices according to Preferred Embodiment 5 with reference to drawings.

Figure 17:
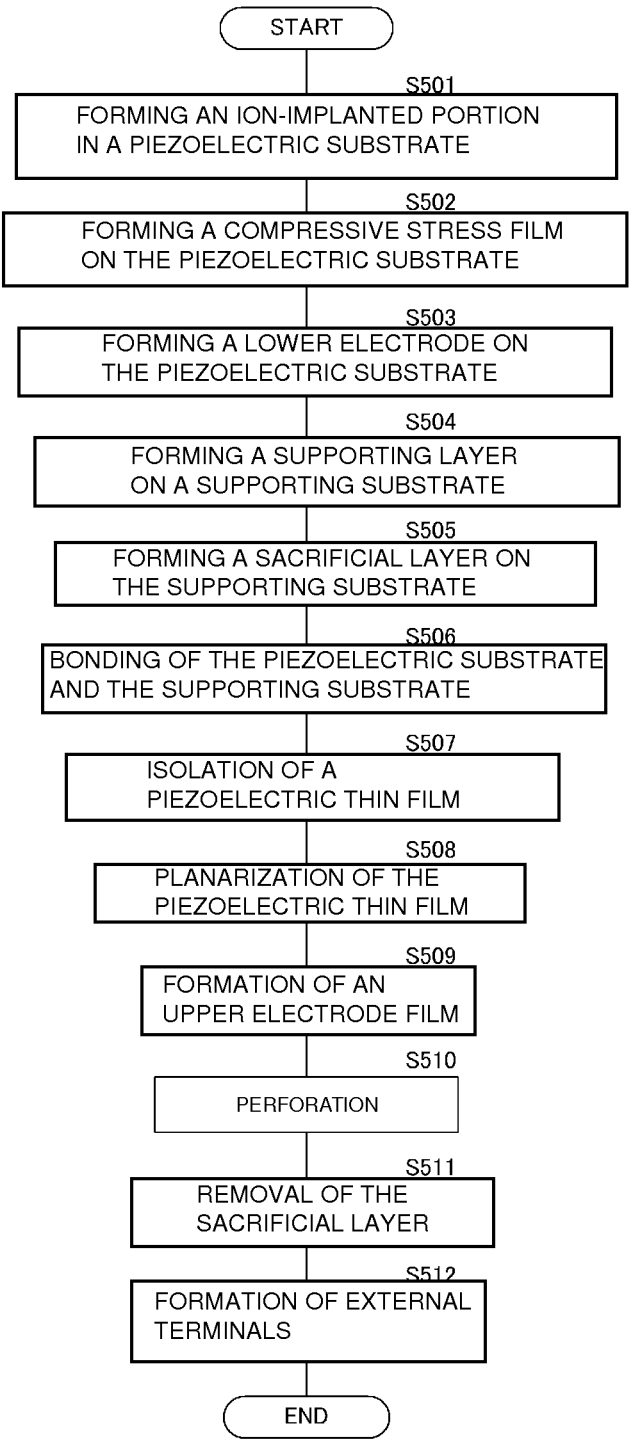
FIG. 17 is a flowchart illustrating the manufacturing method of piezoelectric devices according to Preferred Embodiment 5 of the present invention.

FIG. 17 is a flowchart illustrating the manufacturing method of piezoelectric devices according to Preferred Embodiment 5. FIGS. 18A to 20 show schematic cross-sectional diagrams illustrating the manufacturing steps of piezoelectric devices presented in FIG. 17. In the following description, a method for manufacturing piezoelectric devices having a membrane structure, such as bulk acoustic wave devices (see FIG. 19), plate wave devices (see FIG. 20), and Lamb wave devices, is detailed as an illustrative manufacturing method of piezoelectric devices.

Steps S501, S502, and S508 of the manufacturing method of piezoelectric devices according to the present preferred embodiment, indicated in FIG. 17, are the same as steps S101, S102, and S108 in FIG. 3. The other steps (S503 to S507 and S509 to S512) are different.

The first step is to prepare a piezoelectric single crystal substrate 1 that contains ions implanted thereinto in step S501 and has a compressive stress film formed in step S502. After these two steps, this piezoelectric single crystal substrate 1 has a substantially flat shape with reduced warpage.

Figure 18A:
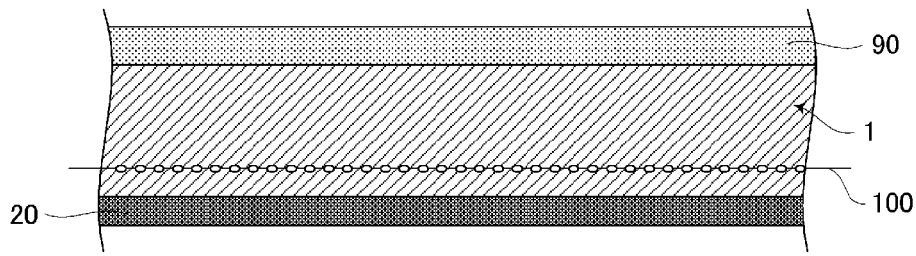
FIGS. 18A-18D are schematic cross-sectional diagrams illustrating some of the manufacturing steps of piezoelectric devices presented in FIG. 17.

A lower electrode film 20 having a predetermined thickness is then formed on the surface 12 on the ion-implanted portion 100 side of the piezoelectric single crystal substrate 1 from Al (aluminum) or a similar material as illustrated in FIG. 18A (S503 in FIG. 17). It is not essential that the lower electrode film 20 be made of Al; a layer of or a laminate consisting of more than one layer of W, Mo, Ta, Hf, Cu, Pt, Ti Au, and similar materials may be used depending on the desired specifications of the devices.

If the produced devices are plate wave devices, which are structured without the lower electrode film 20 (see FIG. 20), step S503 is omitted.

Figure 18B:
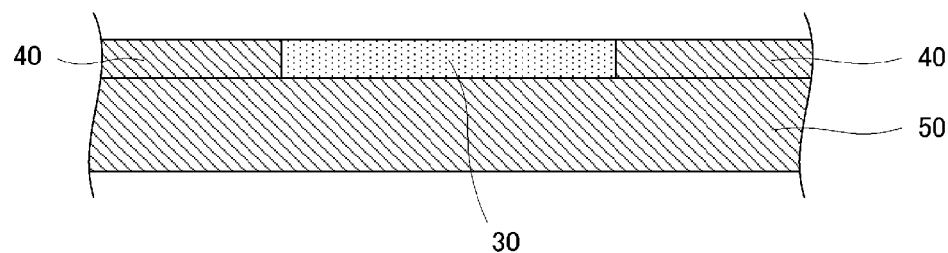

Meanwhile, a supporting layer 40 having a predetermined thickness is formed on the front of a supporting substrate 50 as illustrated in FIG. 18B (S504 in FIG. 17). The supporting layer 40 is made of an insulating material, and any kind of insulating material can be used as long as it is based on an inorganic substance such as silicon oxide or nitride, aluminum oxide, or PSG or an organic substance such as resin and is highly resistant to the gaseous and/or liquid etchant later used to remove a sacrificial layer 30. The supporting layer 40 is formed as a film covering a specific area of the front of the supporting substrate 50 (an area excluding the area later occupied by a sacrificial layer 30) by vapor deposition, sputtering, CVD, spin coating, or a similar method. In other words, this supporting layer 40 is formed beneath the static region of the resulting piezoelectric thin film 10, at which the thin film does not serve as a piezoelectric device. The thickness of the supporting layer 40 is selected to match the desired depth of a void layer 80, which later serves as the hollow region of the membrane. The portion including the supporting layer 40 and the supporting substrate 50 corresponds to the support referred to as in the description of various preferred embodiments of the present invention.

Preferably, the material of the supporting layer 40 is determined taking into account the relationship between its coefficient of linear expansion and that of the piezoelectric single crystal substrate 1 and/or the sacrificial layer 30.

The next step is to form a sacrificial layer 30 having a predetermined thickness on the front of the supporting substrate 50 as illustrated in FIG. 18B (S505 in FIG. 17). The sacrificial layer 30 is made of a material that is easier to etch than upper electrodes 60, the resulting piezoelectric thin film 10, the lower electrode 20, and the supporting layer 40. More specifically, an appropriate film for the given conditions is selected from metal films such as Ni, Cu, and Al, insulating films made of $SiO_2$, ZnO, PSG (phosphosilicate glass) or the like, organic films, and other films. The sacrificial layer 30 is formed as a film occupying a space defined on the front of the supporting substrate 50 to later serve as the void layer 80 (i.e., the space beneath the vibrating region of the resulting piezoelectric thin film 10, at which the thin film serves as a piezoelectric device, and beneath holes 81A and 81B) by vapor deposition, sputtering, CVD, spin coating, or a similar method with a thickness equal to that of the supporting layer 40.

The surface of the sacrificial layer 30 and the supporting layer 40 and that of the lower electrode 20 are then planarized by CMP or a similar treatment.

Figure 18C:
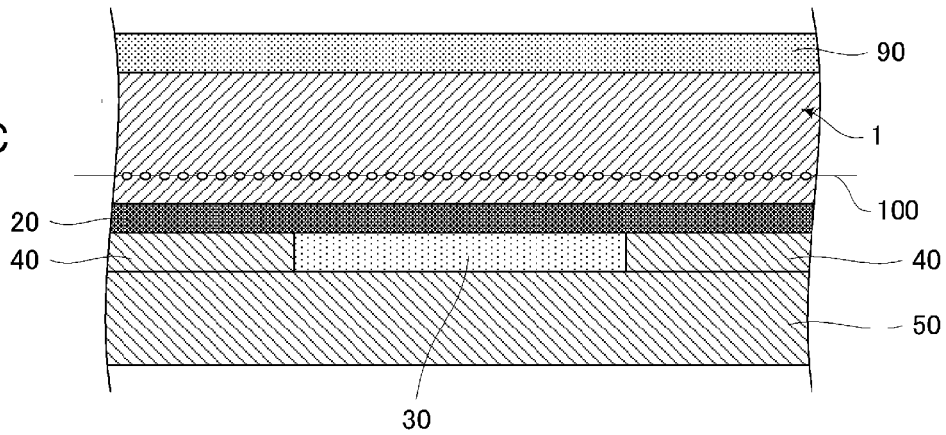

The lower electrode 20 on the piezoelectric single crystal substrate 1 and the sacrificial layer 30 and the supporting layer 40 on the supporting substrate 50 are then joined as illustrated in FIG. 18C (S506 in FIG. 17).

This bonding method is preferably the same as in Preferred Embodiment 1.

The joined body of the piezoelectric single crystal substrate 1 and the supporting substrate 50 illustrated in FIG. 18C is then heated (preferably to about 500° C. in the present preferred embodiment) to initiate isolation at the ion-implanted portion 100 as the isolation plane (S507 in FIG. 17). After this isolation step, the lower electrode 20 on the supporting substrate 50 has a single-crystal piezoelectric thin film 10 on its surface.

This isolation method is preferably the same as in Preferred Embodiment 1.

If the produced devices are bulk acoustic wave devices (see FIG. 19), the next step, following polishing in S508, is to form upper electrodes 63B and 63C having a predetermined thickness on the surface of the piezoelectric thin film 10 from Al (aluminum) or a similar material (S509 in FIG. 17). As with the lower electrode, it is not essential that the upper electrodes 63B and 63C be made of Al; a layer of or a laminate consisting of more than one layer of W, Mo, Ta, Hf, Cu, Pt, Ti Au, and similar materials may be used depending on the desired specifications of the devices. If the produced devices are plate wave devices (see FIG. 20), the next step, following polishing in S508, is to form upper electrodes 60A and 60B and an IDT electrode 60C having a predetermined thickness on the surface of the piezoelectric thin film 10 from Al (aluminum) or a similar material (S509 in FIG. 17). Similarly to the above, it is not essential that these upper electrodes 60A, 60B, and 60C be made of Al; a layer of or a laminate consisting of more than one layer of W, Mo, Ta, Hf, Cu, Pt, Ti, Au, and similar materials may be used depending on the desired specifications of the devices.

After photolithographic patterning of a resist film, a gaseous etchant is introduced to form holes 81A and 81B through which the sacrificial layer 30 is partially exposed on the front side of the piezoelectric thin film 10 (S510 in FIG. 17). If the produced devices are bulk acoustic wave devices (see FIG. 19), this operation also forms openings for partially exposing the lower electrode 20 on a side of the piezoelectric thin film 10.

Figure 19:
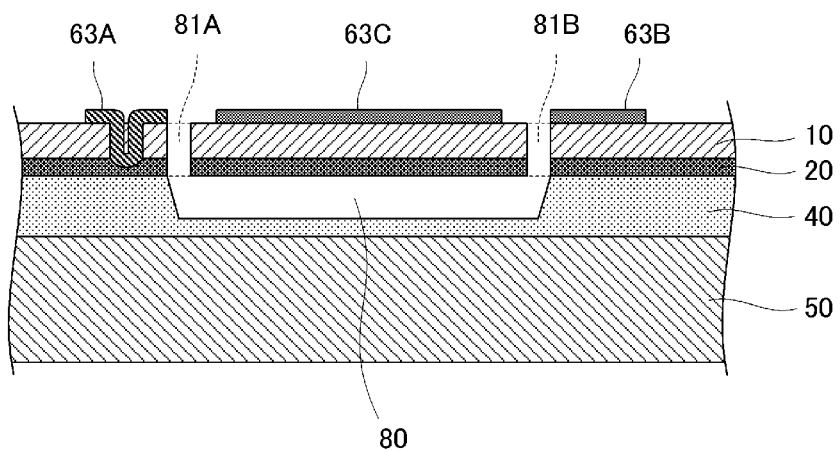
FIG. 19 is a schematic cross-sectional diagram illustrating one of the manufacturing steps of piezoelectric devices presented in FIG. 17.
Figure 20:
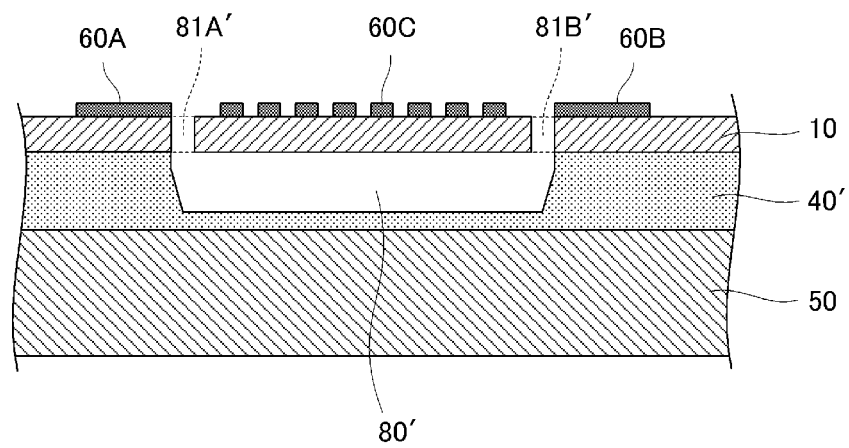
FIG. 20 is a schematic cross-sectional diagram illustrating one of the manufacturing steps of piezoelectric devices presented in FIG. 17.

A gaseous or liquid etchant is then introduced through the holes 81A and 81B to remove the sacrificial layer 30 (S511 in FIG. 17). This turns the space occupied by the sacrificial layer 30 into a void layer 80 as illustrated in FIG. 19 or a void layer 80' as illustrated in FIG. 20.

External terminals are then formed in the same way as in the manufacturing method of piezoelectric devices according to Preferred Embodiment 1 (S512 in FIG. 17). If the produced devices are bulk acoustic wave devices (see FIG. 19), routing wiring 63A is formed as external terminals.

Finally, the thin-film piezoelectric devices formed on the supporting substrate 50 are diced into separate devices in a dicing step, and each device is packaged using a molding die. In this way, thin-film piezoelectric devices are fabricated.

As can be seen from the foregoing, the present preferred embodiment includes the following steps as with the above ones: a compressive stress film 90 is formed in the compressive stress formation step S502 to relieve the piezoelectric single crystal substrate 1 from its warped state, the flat piezoelectric single crystal 1 is bonded to a supporting substrate 50 in the bonding step S506, and then isolation is initiated by heating in the isolation step S507.

Figure 18D:
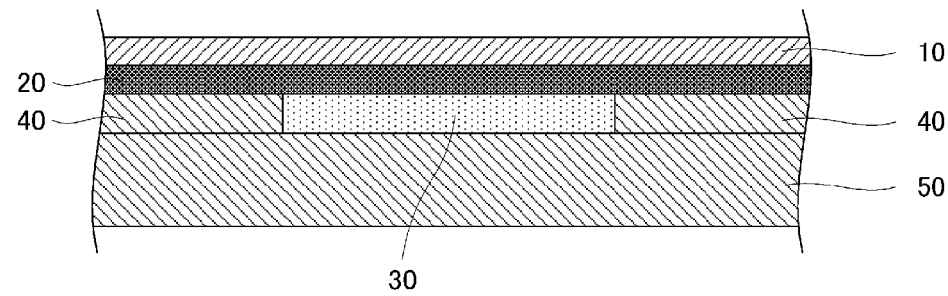

The manufacturing method of piezoelectric devices according to the present preferred embodiment therefore has similar effects to that according to Preferred Embodiment 1. Furthermore, the piezoelectric thin film 10 is formed with the surface used as the ion-implanted portion 100 facing upwards as illustrated in FIG. 18D, and thus stress is applied to the upper electrode 63C or IDT electrode 60C side as illustrated in FIGS. 19 and 20. The removal of the sacrificial layer 30 is therefore unlikely to cause the piezoelectric thin film 10 and the supporting layer 40 to stick to each other despite the close distance between them.

The following describes the manufacturing method of piezoelectric devices according to Preferred Embodiment 6 with reference to drawings. The manufacturing method of piezoelectric devices according to Preferred Embodiment 6 is different from that described as Preferred Embodiment 2 in that Preferred Embodiment 6 includes a tensile stress film formation step instead of the compressive stress film formation step.

Figure 21:
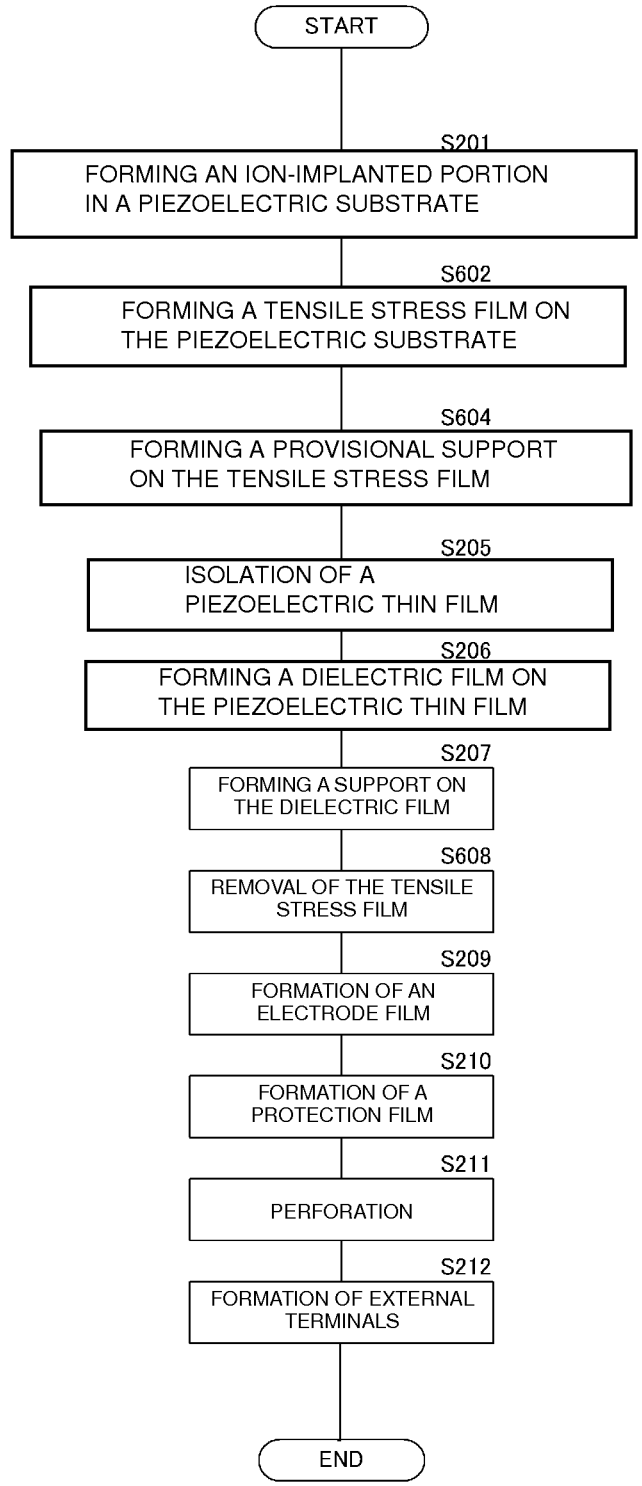
FIG. 21 is a flowchart illustrating the manufacturing method of piezoelectric devices according to Preferred Embodiment 6 of the present invention.
Figure 22:
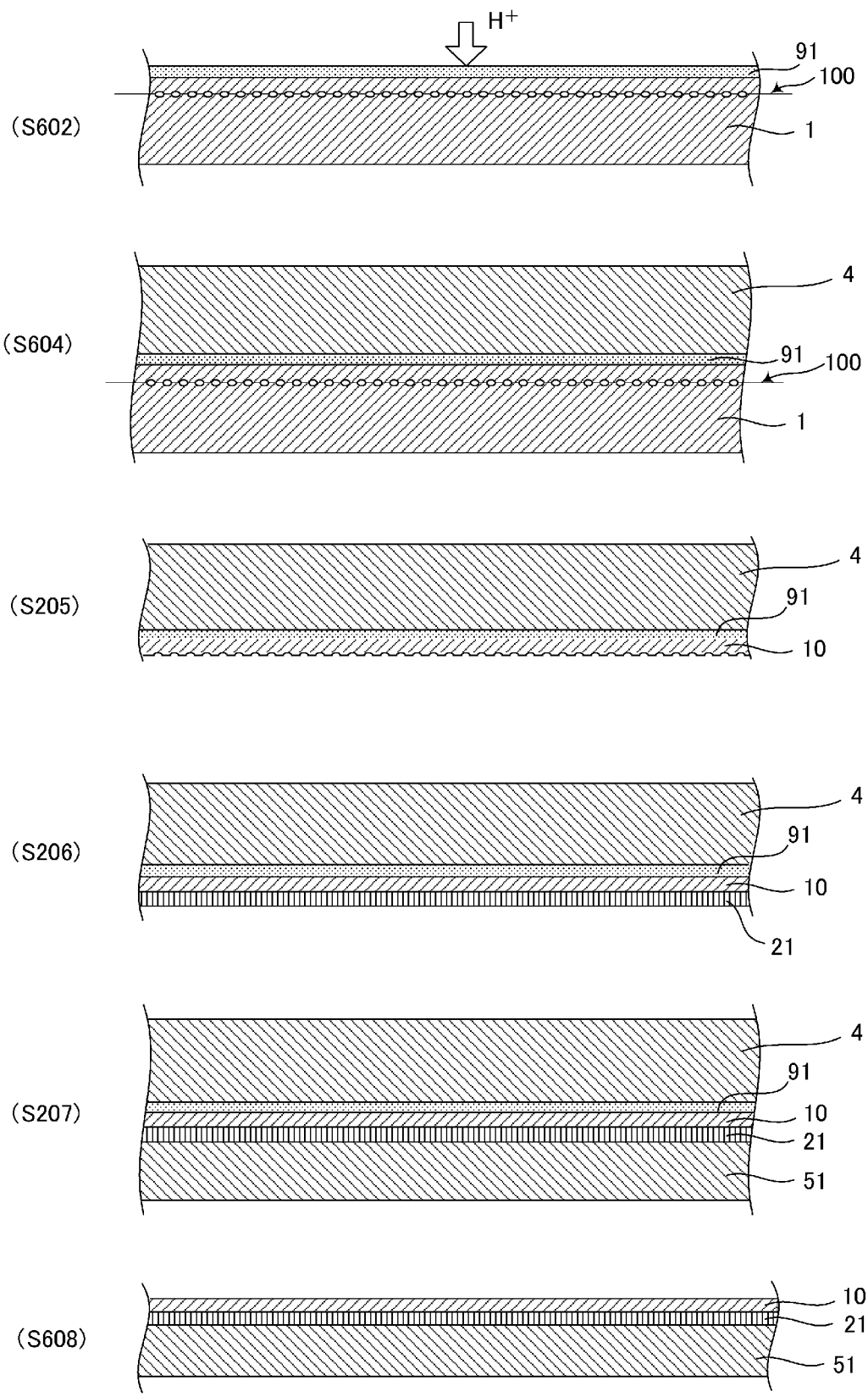
FIG. 22 shows schematic cross-sectional diagrams illustrating some of the manufacturing steps of piezoelectric devices presented in FIG. 21.
Figure 23A:
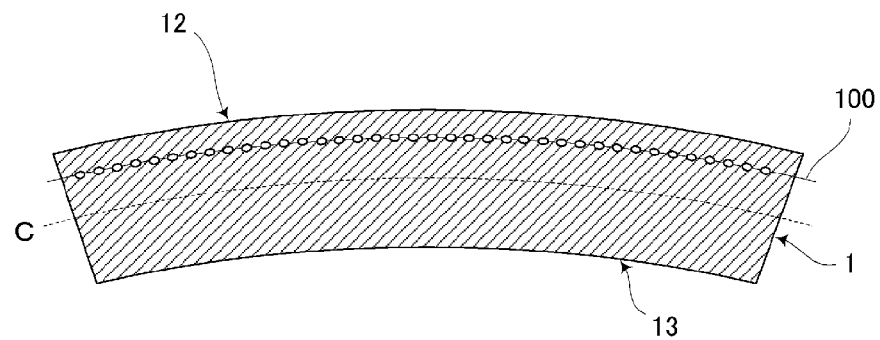
FIG. 23A is a schematic diagram illustrating a warped piezoelectric single crystal substrate after an ion implantation step.
Figure 23B:
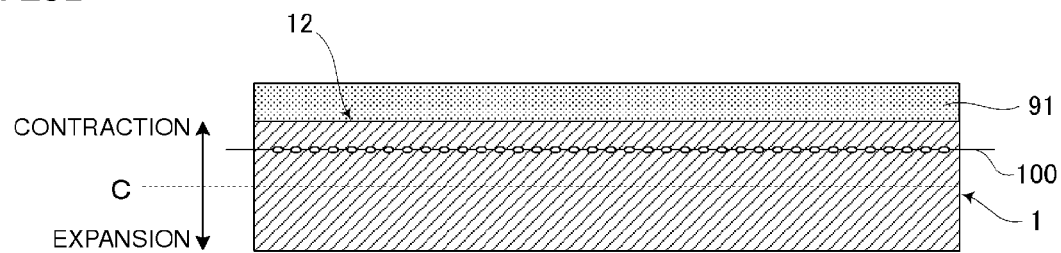
FIG. 23B is a schematic diagram illustrating the piezoelectric single crystal substrate relieved from its warped state by the action of a tensile stress film.

FIG. 21 is a flowchart illustrating the manufacturing method of piezoelectric devices according to Preferred Embodiment 6. FIG. 22 shows schematic cross-sectional diagrams illustrating some of the manufacturing steps of piezoelectric devices presented in FIG. 21. FIG. 23A is a schematic diagram illustrating a warped piezoelectric single crystal substrate after an ion implantation step. FIG. 23B is a schematic diagram illustrating the piezoelectric single crystal substrate relieved from its warped state by the action of a tensile stress film.

The manufacturing method of piezoelectric devices according to Preferred Embodiment 6, illustrated in FIG. 21, includes S602 and S604 instead of S202 to S204 and S608 instead of S208, and the other steps (S201, S205 to S207, and S209 to S212) are the same as those in FIG. 9. The following thus details S602, S604, and S608.

A tensile stress film 91 is formed on the surface 12 on the ion-implanted portion 100 side of the piezoelectric single crystal substrate 1 as illustrated in FIGS. 22, 23A and 23B (S602 in FIGS. 21 and 22). The tensile stress film 91 pulls the surface 12 on the ion-implanted portion 100 side of the piezoelectric single crystal substrate 1. Furthermore, the tensile stress film 91 doubles as the etching substrate layer 3 mentioned in Preferred Embodiment 2 (see FIG. 10) and thus is made of a material that can be etched later in S208 with sufficient selectivity against the piezoelectric thin film 10 and the provisional supporting body 4. Non-limiting examples of materials used to make the tensile stress film 91 include silicon oxide, silicon nitride, aluminum oxide, aluminum nitride, zinc oxide, and tantalum oxide. The tensile stress film 91 is formed on the surface 12 on the ion-implanted portion 100 side of the piezoelectric single crystal substrate 1 by vapor deposition, sputtering, CVD, or a similar method. Regardless of what film formation method is used, the conditions of film formation, such as materials and film thickness, are selected in a way that the formed film should pull the surface 12 on the ion-implanted portion 100 side of the piezoelectric single crystal substrate 1.

Once the tensile stress film 90 is formed on the surface 12 on the ion-implanted portion 100 side during the tensile stress film formation step S602, the tensile stress produced by the tensile stress film 91 is applied to the half of the piezoelectric single crystal substrate 1 located on the ion-implanted portion 100 side with respect to the center line C of the thickness of the piezoelectric single crystal substrate 1 (see FIGS. 23A and 23B). The applied tensile stress pulls the half of the piezoelectric single crystal substrate 1 on the ion-implanted portion 100 side with respect to the center line C and causes this portion to contract. As a result, the piezoelectric single crystal substrate 1 is relieved from its warped state and becomes substantially flat.

The tensile stress produced by the tensile stress film 91 formed in the tensile stress film formation step S602 is not enough to make the piezoelectric single crystal substrate 1 absolutely flat. However, it is enough to reduce the amount of warpage, and the reduced amount of warpage results in the crystal lattice spacing in the piezoelectric thin film 10 after the heating step S205 being closer to that before ion implantation than without reduction of the amount of warpage.

In the present preferred embodiment, therefore, the piezoelectric single crystal substrate 1 also has a substantially flat shape with reduced warpage while a provisional support 4 is formed on it during the provisional support formation step (S604 in FIGS. 21 and 22). The method and materials used to form the provisional support 4 in this step preferably are the same as in S204 of Preferred Embodiment 2.

As a subsequent step, a provisional supporting substrate removal step is carried out to remove a provisional supporting substrate including the tensile stress film 91 and the provisional support 4 (S208 in FIG. 11, S608 in FIG. 22). In this step, the provisional supporting substrate is removed preferably by wet-etching or dry-etching the tensile stress film instead of the etching substrate layer 3 mentioned in Preferred Embodiment 2. The method used to remove the provisional supporting substrate in this step is preferably the same as in S208 of Preferred Embodiment 2.

Finally, electrode formation and some subsequent steps are carried out in the same way as in Preferred Embodiment 2 (S209 to S212 in FIGS. 11 and 21), followed by dicing and molding steps, to complete the surface acoustic wave devices.

The manufacturing method of piezoelectric devices according to the present preferred embodiment therefore has similar effects to that according to Preferred Embodiment 2.

Although the description of the present preferred embodiment takes bulk-wave piezoelectric devices and plate wave devices as non-limiting examples, manufacturing methods according to various preferred embodiments of the present invention can also be applied to other devices that are based on a piezoelectric single crystal thin film and have a membrane, such as gyroscopic devices, RF switches, and vibrational electric generators, for example.

Furthermore, the descriptions of the above preferred embodiments should be construed as being illustrative in all respects and not restrictive. The scope of the present invention is defined by the claims rather than the above preferred embodiments. It is also intended that the scope of the present invention includes equivalents of the claims and all modifications that fall within the claims.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A method for manufacturing a piezoelectric device including a piezoelectric thin film and a support that supports the piezoelectric thin film, the method comprising the steps of:
    implanting an ionized element into a piezoelectric substrate such that a concentration peak of the ionized element implanted into the piezoelectric substrate is formed in the piezoelectric substrate;
    forming a stress layer on the piezoelectric substrate such that the stress layer causes a surface on an ion-implanted side of the piezoelectric substrate to contract;
    forming the support; and
    heating the piezoelectric substrate to isolate the piezoelectric thin film from the piezoelectric substrate at the concentration peak of the ionized element implanted into the piezoelectric substrate as an isolation plane.

2. The method according to claim 1, wherein
    the step of forming the stress layer includes forming as the stress layer a compressive stress film that compresses the surface on the ion-implanted side of the piezoelectric substrate, on a back side of the piezoelectric substrate, which is opposite to the surface on the ion-implanted side; and
    the step of forming the support includes forming the support on the ion implantation plane side of the piezoelectric substrate.

3. The method according to claim 2, wherein the step of forming the compressive stress film includes a step of forming the compressive stress film on the back side of the piezoelectric substrate, which is opposite to the surface on the ion-implanted side, using a material having a smaller coefficient of linear expansion than that of the piezoelectric substrate and then subjecting the compressive stress film to a temperature lower than that during the formation of the compressive stress film to confine the surface on the ion-implanted side of the piezoelectric substrate while applying compressive stress to the surface on the implanted side of the piezoelectric substrate.

4. The method according to claim 2, wherein the step of forming the compressive stress film includes a step of forming the compressive stress film on the back side of the piezoelectric substrate, which is opposite to the surface on the ion-implanted side of the piezoelectric substrate, using a material having a larger coefficient of linear expansion than that of the piezoelectric substrate and then subjecting the compressive stress film to a temperature higher than that during the formation of the compressive stress film to confine the surface on the ion-implanted side of the piezoelectric substrate while applying compressive stress to the surface on the implanted side of the piezoelectric substrate.

5. The method according to claim 4, wherein the dielectric film is formed of one of silicon oxide, silicon nitride, aluminum oxide, and aluminum nitride.

6. The method according to claim 4, wherein the dielectric film is made by performing one of vapor deposition, sputtering, and chemical vapor deposition.

7. The method according to claim 2, wherein the step of implanting an ionized element is carried out after the step of forming the compressive stress film.

8. The method according to claim 2, wherein the compressive stress film is made of one of silicon oxide, silicon nitride, aluminum oxide, aluminum nitride, zinc oxide, and tantalum oxide.

9. The method according to claim 2, wherein the compressive stress film is made by performing one of vapor deposition, sputtering, and chemical vapor deposition.

10. The method according to claim 2, wherein the compressive stress film is applied to the back side of the piezoelectric substrate such that compressive stress produced by the compressive stress film is applied to half of the piezoelectric substrate located on the ion-implanted side with respect to a center line of a thickness of the piezoelectric substrate.

11. The method according to claim 1, further comprising forming a provisional support on the ion implantation plane side of the piezoelectric substrate; wherein
    the step of forming the stress layer includes forming as the stress film a compressive stress film that compresses the surface on the ion-implanted side of the piezoelectric substrate, on a back side of the piezoelectric substrate, which is opposite to the surface on the ion-implanted side; and the step of forming the support includes forming the support on the piezoelectric thin film isolated from the piezoelectric substrate in the step of heating the piezoelectric substrate.

12. The method according to claim 1, further comprising a step of forming a provisional support on the ion-implanted side of the piezoelectric substrate; wherein
the step of forming the stress layer includes forming a tensile stress film that pulls the surface on the ion-implanted side of the piezoelectric substrate on the surface as the stress layer; and
the step of forming the support includes the step of forming the support on the piezoelectric thin film isolated from the piezoelectric substrate in the step of heating the piezoelectric substrate.

13. The method according to claim 1, further comprising a step of forming an interdigital electrode film on the piezoelectric thin film formed on a front of the support.

14. The method according to claim 13, further comprising a step of forming a dielectric film on the piezoelectric thin film to cover the interdigital electrode film.

15. The method according to claim 1, further comprising:
a step of forming a sacrificial layer in a space defined to later serve as a void layer existing between the piezoelectric thin film and the support;
a step of exposing to make the sacrificial layer partially exposed on a side of the piezoelectric thin film by etching to form a hole through the piezoelectric thin film; and
a step of removing the sacrificial layer through the hole.

16. The method according to claim 1, wherein the piezoelectric substrate is one of a lithium tantalum substrate, a lithium niobate substrate, a lithium tetraborate substrate, a langasite substrate, and a potassium niobate substrate.

17. The method according to claim 1, wherein the support is one of a silicon substrate, a glass substrate, a ceramic substrate, a quartz substrate, a sapphire substrate, and a piezoelectric single crystal film substrate.

18. The method according to claim 1, wherein the step of implanting the ionized element into the piezoelectric substrate includes the step of implanting hydrogen ions into the piezoelectric substrate.

19. The method according to claim 18, wherein a thickness of the piezoelectric substrate is at least 10 times a depth of a hydrogen-containing portion formed in the step of implanting hydrogen ions into the piezoelectric substrate.

20. The method according to claim 1, wherein the piezoelectric device is one of a plate wave device, a gyroscopic device, an RF switch, and a vibrational electric generator.

* * * * *